(12) United States Patent
Namiki et al.

(10) Patent No.: US 10,754,065 B2
(45) Date of Patent: *Aug. 25, 2020

(54) RETARDATION FILM, CIRCULARLY-POLARIZING PLATE, AND IMAGE-DISPLAYING DEVICE

(71) Applicants: NITTO DENKO CORPORATION, Ibaraki-shi (JP); Mitsubishi Chemical Corporation, Chiyoda-ku (JP)

(72) Inventors: Shingo Namiki, Fukuoka (JP); Yuuichi Hirami, Fukuoka (JP); Hisatoshi Uehara, Kanagawa (JP); Hiroyuki Hayashi, Kanagawa (JP); Takashi Shimizu, Osaka (JP); Hiroshi Sumimura, Osaka (JP); Nao Murakami, Osaka (JP)

(73) Assignees: NITTO DENKO CORPORATION, Ibaraki-shi (JP); Mitsubishi Chemical Corporation, Chiyoda-ku (JP)

( * ) Notice: Subject to any disclaimer, the term of this patent is extended or adjusted under 35 U.S.C. 154(b) by 52 days.

This patent is subject to a terminal disclaimer.

(21) Appl. No.: 15/294,055

(22) Filed: Oct. 14, 2016

(65) Prior Publication Data
US 2017/0031061 A1 Feb. 2, 2017

Related U.S. Application Data

(63) Continuation of application No. PCT/JP2015/061643, filed on Apr. 15, 2015.

(30) Foreign Application Priority Data
Apr. 16, 2014 (JP) .................................. 2014-084696

(51) Int. Cl.
*G02B 1/08* (2006.01)
*G02B 5/30* (2006.01)
(Continued)

(52) U.S. Cl.
CPC .............. *G02B 1/08* (2013.01); *C08G 63/64* (2013.01); *G02B 5/3083* (2013.01);
(Continued)

(58) Field of Classification Search
CPC ...... G02B 1/08; G02B 5/3033; G02B 5/3083; G02B 5/305; C08G 63/64; H01L 51/5281;
(Continued)

(56) References Cited

U.S. PATENT DOCUMENTS 6,565,974 B1 5/2003 Uchiyama et al.
RE39,753 E 7/2007 Uchiyama et al.
(Continued)

FOREIGN PATENT DOCUMENTS

CN 1818723 A 8/2006
CN 101322055 A 12/2008
(Continued)

OTHER PUBLICATIONS

Extended European Search Report dated Oct. 13, 2017 in Patent Application No. 15779195.5.
(Continued)

*Primary Examiner* — Ruiyun Zhang
(74) *Attorney, Agent, or Firm* — Oblon, McClelland, Maier & Neustadt, L.L.P.

(57) ABSTRACT

An object of the present invention is to provide a retardation film excellent in various properties such as optical properties, heat resistance, mechanical properties, and reliability. The present invention relates to a retardation film containing a thermoplastic resin and composed of a single layer, in which the retardation film has a value of wavelength dispersion that is a ratio of retardations at a wavelength of 450 nm and at a wavelength of 550 nm being 0.75 or more and 0.92 or less; a birefringence at a wavelength of 550 nm and
(Continued)

the wavelength dispersion satisfy a relationship of $\Delta n \geq 0.0140 \times (R450/R550) - 0.0082$; and a photoelastic coefficient is $25 \times 10^{-12}$ $Pa^{-1}$ or less.

8 Claims, 1 Drawing Sheet

(51) Int. Cl.
  *H01L 51/52* (2006.01)
  *C08G 63/64* (2006.01)
(52) U.S. Cl.
  CPC ...... *H01L 51/5275* (2013.01); *H01L 51/5281* (2013.01); *G02B 5/3033* (2013.01); *Y10T 428/10* (2015.01); *Y10T 428/1036* (2015.01); *Y10T 428/1041* (2015.01)
(58) Field of Classification Search
  CPC ..... G02F 1/13363; G02F 2001/133637; G02F 2001/133638; Y10T 428/10; Y10T 428/1036; Y10T 428/105
  USPC ........ 428/1.1, 1.3, 1.33; 359/489.07, 489.02, 359/489.01; 349/117; 528/298; 562/466, 488; 568/808
  See application file for complete search history.

(56) References Cited

U.S. PATENT DOCUMENTS

| | | | |
|---|---|---|---|
| 8,218,937 | B2 | 7/2012 | Iida et al. |
| 8,293,861 | B2 | 10/2012 | Motoyoshi et al. |
| 8,455,611 | B2 | 6/2013 | Motoyoshi et al. |
| 8,778,486 | B2 | 7/2014 | Tanaka et al. |
| 8,877,304 | B2 | 11/2014 | Motoyoshi et al. |
| 2006/0177607 | A1 | 8/2006 | Ohmori et al. |
| 2007/0134446 | A1 | 6/2007 | Inagaki et al. |
| 2010/0003490 | A1 | 1/2010 | Iida et al. |
| 2010/0104777 | A1 | 4/2010 | Motoyoshi et al. |
| 2010/0301271 | A1 | 12/2010 | Adlem et al. |
| 2011/0288261 | A1 | 11/2011 | Motoyoshi et al. |
| 2012/0170118 | A1 | 7/2012 | Wang et al. |
| 2012/0308796 | A1 | 12/2012 | Tanaka et al. |
| 2013/0005939 | A1 | 1/2013 | Motoyoshi et al. |
| 2014/0268334 | A1 | 9/2014 | Tanaka et al. |
| 2015/0247002 | A1 | 9/2015 | Uehara et al. |

FOREIGN PATENT DOCUMENTS

| | | |
|---|---|---|
| CN | 102227657 A | 10/2011 |
| CN | 104718237 | 6/2015 |
| JP | 5-27118 | 2/1993 |
| JP | 10-68816 | 3/1998 |
| JP | 2000-137116 | 5/2000 |
| JP | 3325560 | 9/2002 |
| JP | 2003-279730 | 10/2003 |
| JP | 2008-112124 | 5/2008 |
| JP | 2008-222965 | 9/2008 |
| JP | 2010-537955 | 12/2010 |
| JP | 2011-79897 | 4/2011 |
| JP | 5119250 | 1/2013 |
| JP | 5204200 | 6/2013 |
| TW | 200628511 | 8/2006 |
| TW | 200919035 | 5/2009 |
| TW | 201030053 A1 | 8/2010 |
| WO | WO 2010/064721 A1 | 6/2010 |
| WO | WO 2014/061677 A1 | 4/2014 |

OTHER PUBLICATIONS

International Search Report dated Jun. 30, 2015 in PCT/JP2015/061643 filed on Apr. 15, 2015 (with English translation).
Written Opinion dated Jun. 30, 2015 in PCT/JP2015/061643 filed on Apr. 15, 2015.
Combined Chinese Office Action and Search Report dated Jul. 23, 2018, in Patent Application No. 201580019891.8 (with English translation), 16 pages.
Office Action dated Sep. 26, 2018 in European Patent Application No. 15 779 195.5, 4 pages.
Office Action dated Feb. 5, 2019, in Japanese Patent Application No. 2015-083626 (with English translation).
Office Action dated Apr. 17, 2019 in Chinese Patent Application No. 201580019891.8 (w/ English translation).
Decision of Refusal dated Sep. 10, 2019 in Japanese Patent Application No. 2015-083626 filed Apr. 15, 2015. (with English translation).
Office Action dated Sep. 20, 2019 in European Patent Application No. 15779195.5 filed Apr. 15, 2015.
Combined Chinese Office Action and Search Report dated Nov. 5, 2019, in Patent Application No. 201580019891.8, 10 pages (with English translation).
Office Action dated May 12, 2020 in the corresponding European patent application No. 15779195 5 filed Apr. 15, 2015.
Taiwanese Office Action dated Jul. 25, 2017 in Patent Application No. 104112192 (with English Translation).
Chinese Office Action dated May 25, 2020 in the corresponding Chinese Patent Application No. 201580019891.8 filed Apr. 15, 2015 (with Machine English translation) , citing document AO therein.

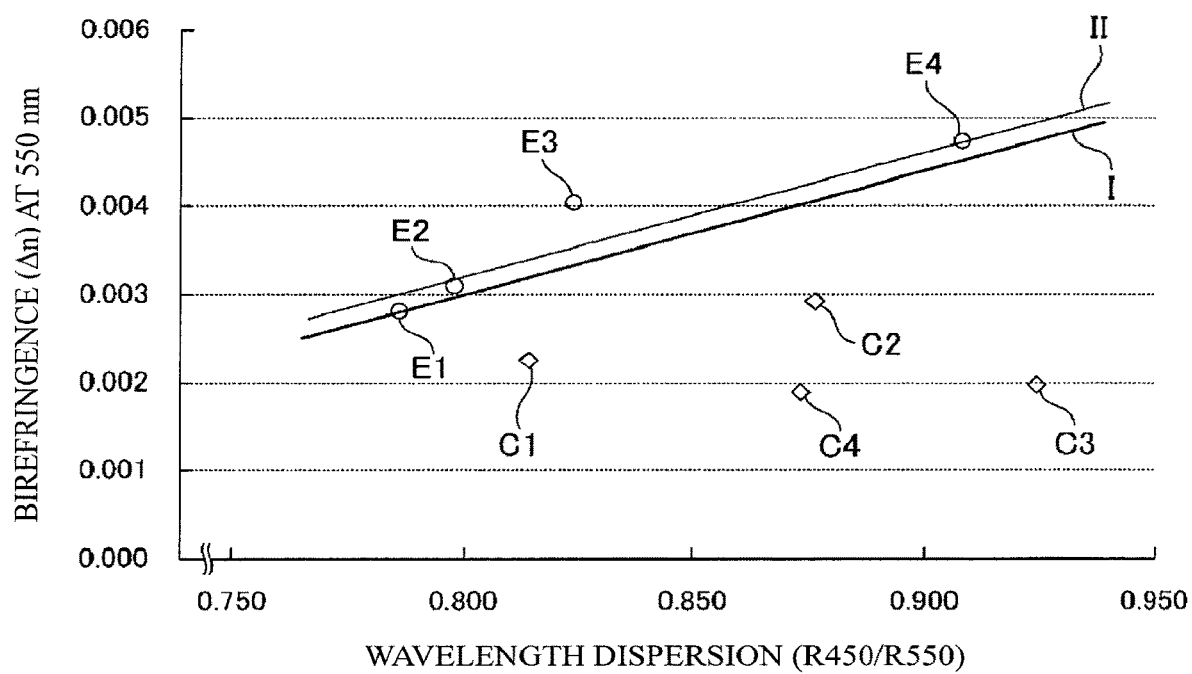

RETARDATION FILM, CIRCULARLY-POLARIZING PLATE, AND IMAGE-DISPLAYING DEVICE

TECHNICAL FIELD

The present invention relates to a thin retardation film excellent in various properties such as optical properties, heat resistance, mechanical properties, and reliability, and to a circularly polarizing plate and an image display device each obtained by using the same.

BACKGROUND ART

In recent years, demands for an optical transparent resin used in an optical system such as optical lens, optical film and optical recording medium are increasing. Among others, in particular, the spread of a thin flat panel display (FPD) typified by a liquid crystal display or an organic EL (Electro Luminescence) display is notable, and various optical films have been developed and are utilized for the purpose of improving the contrast or tinting or enhancing the display quality such as enlargement of viewing angle and prevention of external light reflection.

In an organic EL display, a ¼ wavelength plate for preventing external light reflection is used. In order to suppress tinting and enable clear black display, the retardation film used for the ¼ wavelength plate is required to have a broadband wavelength dispersion property making it possible to obtain ideal retardation properties at each wavelength in the visible region.

In this connection, it is disclosed that a broadband retardation film is obtained, for example, by laminating two kinds of retardation films differing in the wavelength dispersion of birefringence while arranging respective slow axes to run at right angles to one another (Patent Document 1). It is also disclosed a method of obtaining by laminating a ½ wavelength plate and a ¼ wavelength plate while arranging respective slow axes in a specific configuration (Patent Document 2). Furthermore, a broadband retardation film composed of a cellulose acetate having a specific acetylation degree (Patent Document 3), and a retardation film which is composed of a polycarbonate copolymer containing a bisphenol structure having a fluorene ring in the side chain thereof and exhibits reverse wavelength dispersion property of decreasing in the retardation as the wavelength becomes shorter (Patent Document 4), are disclosed.

In recent years, a large number of the resins having a fluorene ring in the side chain as described above have been reported and proposed as a material useful for optical use by utilizing the characteristics derived from the fluorene ring, such as optical properties and heat resistance. In these resins, 9,9-bis[4-(2-hydroxyethoxy)phenyl]fluorene or 9,9-bis(4-hydroxy-3-methylphenyl)fluorene, each of which is a relatively easily available monomer, is often used (e.g., Patent Documents 5 and 6).

A resin having a new structure has also been developed. In Patent Document 7, a diamine compound having a fluorene ring in the side chain is disclosed, and a stretched film of a polyimide resin using the compound is described. In Patent Document 8, a polycarbonate resin using a fluorene compound containing no aromatic ring on the main chain is disclosed. In Patent Document 9, a dihydroxy compound or a diester compound, each having two fluorene rings in a single molecule, are disclosed, and a stretched film of a polyester resin using such a compound is described.

PRIOR ART DOCUMENT

Patent Document

Patent Document 1: JP-A-H05-27118
Patent Document 2: JP-A-H10-68816
Patent Document 3: JP-A-2000-137116
Patent Document 4: Japanese Patent No. 3,325,560
Patent Document 5: Japanese Patent No. 5,119,250
Patent Document 6: Japanese Patent No. 5,204,200
Patent Document 7: JP-A-2008-112124
Patent Document 8: JP-A-2008-222965
Patent Document 9: US-A-2012/0170118

SUMMARY OF THE INVENTION

Problems that the Invention is to Solve

Development in the FPD field is remarkable, and the retardation film is required to be more enhanced in terms of optical properties, quality, reliability, and the like and be reduced in the film thickness. It is also demanded to reduce the material cost and to enhance the productivity in each step such as film production, stretching and lamination. In turn, combination of various properties is being required of the retardation film. For example, a material having the required wavelength dispersion property, having various physical properties such as low photoelastic coefficient, high heat resistance, melt processability and mechanical strength, and ensuring that the intrinsic birefringence is large, the flexibility and stretchability are excellent, and a high degree of molecular orientation is obtained by stretching, is desired as the material used for the retardation film.

The method of laminating retardation films as in Patent Documents 1 and 2 is, however, disadvantageous in that the polarizing plate becomes thick and since respective retardation films must be laminated to arrange their slow axes in a specific configuration, the productivity or yield of the polarizing plate is reduced. The retardation film of Patent Document 3 or 4 has reverse wavelength dispersion property, and broadband retardation properties are obtained by one sheet of the film alone, but cellulose acetate of Patent Document 3 has a problem that the heat resistance is insufficient and an image spot is generated due to dimensional deformation resulting from moisture absorption.

The retardation film composed of a polycarbonate resin having a fluorene ring, described in Patent Documents 4 to 6, is known to be useful as a retardation film exhibiting reverse wavelength dispersion property or as a circularly polarizing plate for preventing external light reflection of the image display device. However, it has been found from studies by the present inventors that: in the case of a resin using 9,9-bis(4-hydroxy-3-methylphenyl)fluorene, the film is brittle and can be hardly stretched to such an extent as obtaining a high orientation degree; and in the case of a resin using 9,9-bis[4-(2-hydroxyethoxy)phenyl]fluorene, the photoelastic coefficient is slightly high and the reliability under high temperature is poor, though the stretchability is relatively excellent.

As means for improving various properties, it may be considered to change the copolymerization components, to adjust the ratio or the like. However, 9,9-bis(4-hydroxy-3-methylphenyl)fluorene is characterized in that the heat resistance is very high but the resin becomes brittle, and it has been difficult to improve the flexibility of the resin while maintaining appropriate heat resistance. In the case of 9,9-bis[4-(2-hydroxyethoxy)phenyl]fluorene, since this monomer component must be incorporated in an amount of approximately from 50 to 70 mass % so as to develop the desired reverse wavelength dispersion property, the freedom degree of molecular design for copolymerization is low, and it has been difficult to satisfy both the physical properties such as heat resistance and mechanical strength and the optical properties.

In the polycarbonate resin using a diol having a fluorene ring as described in Patent Document 8, the properties such as reverse wavelength dispersion property, photoelastic coefficient and heat resistance are insufficient. In Patent Document 9, it is stated that the polyester described therein has negative refractive index anisotropy, that is, the refractive index in the stretching direction is smaller than the refractive index in a direction orthogonal to stretching. However, the retardation film must have positive refractive index anisotropy, and the above-described polyester stretched film does not satisfy this requirement. In addition, Patent Document 9 is silent on the wavelength dependency of retardation.

As described above, it is difficult for conventional retardation films to achieve various properties such as reverse wavelength dispersion property, optical properties, heat resistance and mechanical strength in a balanced manner. In order to drastically improve the properties of a retardation film, a new compound excellent in the balance of various properties must be used for the raw material.

An object of the present invention is to solve those problems and provide a thin retardation film excellent in various properties, such as optical properties, heat resistance, mechanical properties and reliability, and to a circularly polarizing plate and an image display device each obtained by using the same.

Means for Solving the Problems

The present inventors have made intensive studies to attain the object above, as a result, they found that in a film containing a thermoplastic resin, a retardation film whose optical properties are controlled to fall in the following specified ranges expresses excellent optical properties and mechanical properties, and accomplished the present invention.

Specifically, the gist of the present invention resides in the followings.

[1] A retardation film containing a thermoplastic resin and composed of a single layer, in which the retardation film has:

a value of wavelength dispersion (R450/R550) as a ratio of a retardation (R450) at a wavelength of 450 nm and a retardation (R550) at a wavelength of 550 nm being 0.75 or more and 0.92 or less;

a birefringence (Δn) at a wavelength of 550 nm satisfying a relationship of the following mathematical formula (I) with the wavelength dispersion (R450/R550); and a photoelastic coefficient of $25 \times 10^{-12}$ $Pa^{-1}$ or less:

$$\Delta n \geq 0.0140 \times (R450/R550) - 0.0082 \qquad (I).$$

[2] The retardation film according to the above-mentioned [1], in which a refractive index at a sodium d line (589 nm) is from 1.49 to 1.56.

[3] The retardation film according to the above-mentioned [1] or [2], in which the thermoplastic resin has a glass transition temperature of 120° C. or higher and 160° C. or lower.

[4] The retardation film according to any one of the above-mentioned [1] to [3], in which the thermoplastic resin has an elastic modulus of 1 GPa or more and 2.5 GPa or less.

[5] The retardation film according to any one of the above-mentioned [1] to [4], in which the thermoplastic resin contains at least one bonding group of a carbonate bond and an ester bond and one or more structural units selected from the group consisting of a structural unit represented by the following general formula (1) and a structural unit represented by the following general formula (2).

[Chem. 1]

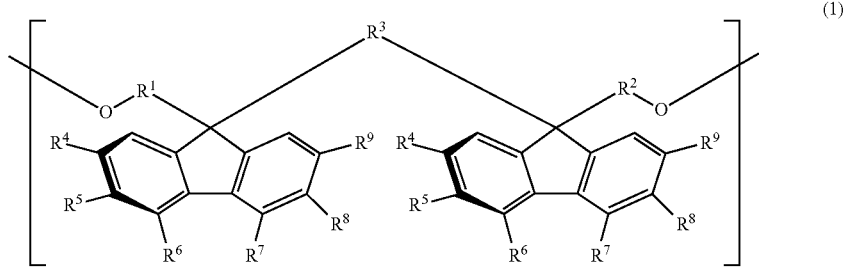

(1)

[Chem. 2]

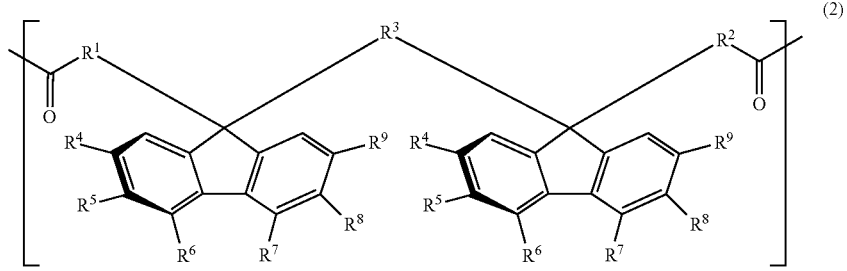

(2)

In the general formula (1) and the general formula (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group. Here, at least two adjacent groups out of $R^4$ to $R^9$ may be linked to each other to form a ring.

[6] The retardation film according to the above-mentioned [5], in which the thermoplastic resin contains the structural unit represented by the general formula (1) or the general formula (2) in an amount of 1% by mass or more and 40% by mass or less in total.

[7] The retardation film according to the above-mentioned [5] or [6], in which in the thermoplastic resin, the content of an aromatic group-containing structural unit (other than the structural unit represented by the general formula (1) and the structural unit represented by the general formula (2)) is 5% by mass or less.

[8] The retardation film according to any one of the above-mentioned [1] to [6], in which the thermoplastic resin contains a structural unit represented by the following general formula (3).

[Chem. 3]

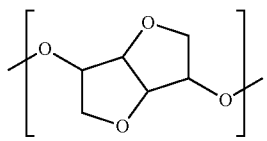

(3)

[9] A circularly polarizing plate containing the retardation film described in any one of the above-mentioned [1] to [8] and a polarizer stacked on the retardation film.

[10] An image display device containing the circularly polarizing plate described in the above-mentioned [9].

[11] An organic EL panel containing the circularly polarizing plate described in the above-mentioned [9].

Advantage of the Invention

The retardation film of the present invention has the above-described specified optical properties. Accordingly, the retardation film of the present invention can be suitably used for an image display device or the like.

BRIEF DESCRIPTION OF DRAWING

FIG. 1 is a graph plotting a birefringence (Δn) and wavelength dispersion (R450/R550) obtained in the Examples and Comparative Examples.

MODE FOR CARRYING OUT THE INVENTION

Embodiments of the present invention are described in detail below, but the description of constitutional requirements disclosed below is one example (representative example) of the embodiment of the present invention, and the present invention is not limited to the following contents as long as it does not go beyond the gist thereof. In the present invention, the "structural unit" indicates a partial structure sandwiched between adjacent linking groups in a polymer, as well as a partial structure sandwiched between a polymerization reactive group present in the terminal portion of a polymer and a linking group adjacent to the polymerizable reaction group.

In the present specification, "% by weight" and "% by mass", "parts by weight" and "parts by mass", and "ppm by weight" and "ppm by mass" are synonymous with each other, respectively.

The retardation film of the present invention is a retardation film containing a thermoplastic resin and composed of a single layer and is characterized by satisfying all of the following (A) to (C).
(A) A value of wavelength dispersion (R450/R550) that is a ratio of a retardation (R450) at a wavelength of 450 nm and a retardation (R550) at a wavelength of 550 nm is 0.75 or more and 0.92 or less;
(B) A birefringence (Δn) at a wavelength of 550 nm and the wavelength dispersion (R450/R550) satisfy a relationship of the following mathematical formula (I); and
(C) A photoelastic coefficient is $25 \times 10^{-12}$ Pa$^{-1}$ or less.

$$\Delta n \geq 0.0140 \times (R450/R550) - 0.0082 \quad (I)$$

<Properties of Retardation Film of the Present Invention>

The retardation film of the present invention is a stretched film obtained by stretching an unstretched film composed of a thermoplastic resin in at least one direction by a stretching method as described later, and is a film having the above-described characteristics through a single layer.

In the retardation film, a slow axis thereof is coincident with a stretching direction (positive refractive index anisotropy), and a value of wavelength dispersion (R450/R550) that is a ratio of a retardation (R450) at a wavelength of 450 nm to a retardation (R550) at a wavelength of 550 nm is 0.75 or more and 0.92 or less. The value of the wavelength dispersion (R450/R550) is preferably 0.78 or more and 0.91 or less, and especially preferably 0.80 or more and 0.90 or less.

In the case where the value of the wavelength dispersion (R450/R550) falls within the above-described specified range, the retardation film not only expresses reverse wavelength dispersion properties such that the retardation is small at a shorter wavelength, but also can achieve ideal retardation characteristics at every wavelength in a visible light region. For example, in the case of using the retardation film as a circularly polarizing plate upon being stuck to a polarizing plate, it is possible to fabricate a circularly polarizing plate capable of forming circular polarization at every wavelength in a visible light region. As a result, a neutral circularly polarizing plate and a display device each having little discoloration can be realized. On the other hand, in the case where the value of the wavelength dispersion (R450/R550) falls outside the above-described specified range, circular polarization is not obtained in at least a part of wavelength region, so that there is a concern that a problem of discoloration is caused in polarizing plates or display devices.

In the retardation film, an in-plane birefringence (Δn) at 550 nm and the wavelength dispersion (R450/R550) satisfy a relationship of the following formula (I). In addition, it is more preferred that the in-plane birefringence (Δn) and the wavelength dispersion (R450/R550) satisfy a relationship of the following formula (II).

$$\Delta n \geq 0.0140 \times (R450/R550) - 0.0082 \quad (I)$$

$$\Delta n \geq 0.0140 \times (R450/R550) - 0.0080 \quad (II)$$

Since the retardation is proportional to a thickness (d) and a birefringence (Δn) of the film, by controlling the birefringence to the above-described specified range, it becomes possible to reveal a retardation as designed through a thin film, and a film conforming to thin instruments can be easily fabricated. In order to reveal a high birefringence, the orientation degree of a polymer molecule must be increased by decreasing the stretching temperature, increasing the stretch ratio, or other means. However, under such a stretching condition, the film is liable to be broken, and therefore, it is more advantageous that a resin to be used is excellent in toughness.

In addition, in order to make the retardation film express reverse wavelength dispersion properties, it is necessary to use a resin in which a component having positive refractive index anisotropy and a component having negative refractive index anisotropy are blended in an appropriate ratio. However, in this case, theoretically, as the reverse wavelength dispersion properties is strong (R450/R550 is small), the intrinsic birefringence of the resin becomes small, and therefore, the birefringence (Δn) revealed by stretching tends to become small. In the retardation film of the present invention, for example, as described later, by incorporating a structural unit derived from a fluorene-based monomer having a fluorene ring in a side chain thereof into the resin, it is possible to impart reverse wavelength dispersion properties while minimizing the reduction of the intrinsic birefringence. Furthermore, by using the above-described fluorene-based monomer, the toughness of the resin is improved, and therefore, it becomes possible to realize high orientation properties as described above.

The retardation film has a photoelastic coefficient of $25 \times 10^{-12}$ $Pa^{-1}$ or less. The photoelastic coefficient is preferably $20 \times 10^{-12}$ $Pa^{-1}$ or less, more preferably $15 \times 10^{-12}$ $Pa^{-1}$ or less, still more preferably $12 \times 10^{-12}$ $Pa^{-1}$ or less, and especially preferably $10 \times 10^{-12}$ $Pa^{-1}$ or less. If the photoelastic coefficient is excessively large, in the case of sticking the retardation film to a polarizing plate, there is a possibility that a reduction of the image quality, such as a phenomenon in which the periphery of a display becomes blurred in white, occurs. In particular, in the case of being used in a large-size display device, this problem is conspicuously caused.

Though it varies depending upon a designed value of the retardation, a thickness of the retardation film is preferably 60 μm or less. The thickness of the retardation film is more preferably 50 μm or less, still more preferably 45 μm or less, and especially preferably 40 μm or less. On the other hand, if the thickness is excessively thin, handling of the film becomes difficult, wrinkles are liable to be generated during the production, and breakage occurs. Thus, a lower limit of the thickness of the retardation film is preferably 10 μM or more, and more preferably 20 μm or more.

The retardation film has a refractive index at a sodium d line (589 nm) of preferably from 1.49 to 1.56. The refractive index is more preferably from 1.50 to 1.55, still more preferably from 1.51 to 1.54, and especially preferably from 1.51 to 1.53. As the refractive index is small, the surface reflection of the retardation film can be inhibited, and the whole light transmittance can be improved. In the resin that is used in the present invention, in order to impart reverse wavelength dispersion properties, it is necessary to blend an aromatic component. Therefore, as compared with wholly aliphatic polymers, the refractive index becomes higher; however, by controlling the content of the aromatic component to the minimum necessary, the refractive index can be controlled to fall within the above-described range.

The retardation film has an internal haze of preferably 3% or less, more preferably 2% or less, and especially preferably 1% or less. If the internal haze of the retardation film is larger than the above-described upper limit, light scattering occurs, and for example, in the case of laminating with a polarizer, there may be the case where depolarization is caused. Though a lower limit of the internal haze is not specifically defined, it is typically 0.1% or more. In measuring the internal haze, by using a sample prepared by sticking an adhesive-applied transparent film, a haze of which has been measured in advance, on the both surfaces of an unstretched film to remove any influence of an external haze, a value obtained by subtracting the haze value of the adhesive-applied transparent film from a measured value of the sample is defined as the internal haze.

The retardation film has a b* value of preferably 3 or less. If the b* value of the film is too large, problems such as discoloration are caused. The b* value is more preferably 2 or less, and especially preferably 1 or less. The b* value is measured with a spectrophotometer, CM-2600d, manufactured by Konica Minolta, Inc.

In the retardation film, irrespective of the thickness thereof, the whole light transmittance of the film per se is preferably 80% or more, more preferably 85% or more, and especially preferably 90% or more. If the transmittance is the above-described lower limit or more, a film with little discoloration is obtained; in the case of being stuck to a polarizing plate, a circularly polarizing plate having a high polarization degree or transmittance is given; and in the case of being used in an image display device, it becomes possible to realize a high display quality. Though an upper limit of the whole light transmittance of the film of the present invention is not particularly limited, it is typically 99% or less.

In the retardation film, the change rate of retardation in reliability evaluation as described later is preferably 5% or less, more preferably 4% or less, and especially preferably 3% or less. If the change rate is larger than the above-described range, for example, in the case of being used in a circularly polarizing plate for prevention of reflection in an organic EL panel, the optical properties of the retardation film change under the use environment, thereby causing an increase in the reflectance or deterioration of the image quality such as color omission.

It is preferred that the retardation film does not undergo brittle fracture in a folding test as described later in an unstretched film state before stretching processing. In a film susceptible to brittle fracture, breakage of the film may readily occur at the time of film production or stretching, deteriorating the production yield. In order for the film not to undergo brittle fracture, it is important that the molecular weight, melt viscosity and glass transition temperature of the resin for use in the present invention are designed to fall in respective preferable ranges above. A method of adjusting the properties of the film by copolymerizing or blending a component capable of imparting flexibility is also effective.

<Properties of Thermoplastic Resin Used in Retardation Film of the Present Invention>

The resin that is used for the retardation film is a thermoplastic resin capable of forming a film by a melt film production method and having excellent stretching processability.

The glass transition temperature of the resin is preferably 120° C. or higher and 160° C. or lower, more preferably 125° C. or higher and 155° C. or lower, and especially preferably 130° C. or higher and 150° C. or lower. If the glass transition temperature is excessively low, the heat resistance tends to be deteriorated, leaving the possibility of causing a dimensional change after film forming or degrading the reliability of quality under the use condition of the retardation film. On the other hand if the glass transition temperature is excessively high, an unevenness may be produced in the film thickness at the time of film forming, the film may become brittle to deteriorate the stretchability, or the transparency of the film may be impaired.

The resin has an elastic modulus of preferably 1 GPa or more and 2.5 GPa or less, more preferably 1.1 GPa or more and 2.3 GPa or less, and especially preferably 1.2 GPa or more and 2.2 GPa or less. If the elastic modulus falls within the above-described range, the film is excellent in handleability and strength. In addition, there may be the case where a stress remains in the stretched film depending upon the stretching condition in producing the retardation film, and also, there may be the case where when laminated with another film or the like to prepare a polarizing plate or when allowed to stand at a high temperature or at a high humidity, a stress is generated in the film. When the stress is applied to the film, there is a concern that the retardation changes, thereby causing an increase in the reflectance or deterioration of the image quality such as color omission, as expressed by relationships of the following formulae.

Retardation change=(Birefringence change)×(Film thickness)

=(Photoelastic coefficient)×(Stress)×(Film thickness)

=(Photoelastic coefficient)×(Elastic modulus)× (Strain)×(Film thickness)

As is understandable from the foregoing formulae, even in the case where the generated stress is identical, by making the photoelastic modulus small, the retardation change can be made small. In addition, if the elastic modulus of the resin is made small, the generated stress can be made small, and in its turn, it becomes possible to minimize the retardation change. The elastic modulus of the retardation film is measured by means of dynamic viscoelasticity measurement as described later.

The melt viscosity of the resin is, under the measurement conditions of a temperature of 240° C. and a shear rate of 91.2 $\sec^{-1}$, preferably 700 Pa·s or more and 5,000 Pa·s or less, more preferably 800 Pa·s or more and 4,000 Pa·s or less, and still more preferably 900 Pa·s or more and 3,500 Pa·s or less. The resin having a melt viscosity of the above-described specified range is excellent in strength and stretchability of the film, and is also excellent in melt formability. The melt viscosity is measured by using a capillary rheometer (manufactured by Toyo Seiki Seisakusho, Ltd.).

In the resin, the saturated water absorption is preferably more than 1.0 mass %. In the case where the saturated water absorption is more than 1.0 mass %, adhesiveness tends to be easily ensured when laminating a film made of the resin to another film or the like. For example, at the time of lamination to a polarizing plate, since the film is hydrophilic, the contact angle of water is low, and the adhesive is easily designed freely, so that high adhesion can be designed. If the saturated water absorption is 1.0 mass % or less, the film becomes hydrophobic, and the contact angle of water is high, making the design of adhesiveness difficult. In addition, the film tends to be readily charged, whereby it tends to cause a problem of increase in the appearance defect when incorporated into a circularly polarizing plate or an image display device, such as an entrainment of an extraneous matter or the like. On the other hand, if the saturated water absorption exceeds 3.0 mass %, the durability of optical properties under a humidity environment tends to be deteriorated, which is unpreferable. In the film of the present invention, the saturated water absorption is preferably more than 1.0 mass % and more preferably 1.1 mass % or more, and is preferably 3.0 mass % or less and more preferably 2.5 mass % or less. Depending on the use conditions of the film or an image display device using the same, the saturated water absorption may be set to 1.0 mass % or less.

<Preferred Composition of Resin>

It is preferred that the thermoplastic resin that is used for the retardation film of the present invention contains at least one bonding group of a carbonate bond and an ester bond and a specified structural unit derived from a divalent oligofluorene as described later. That is, as the resin, a polycarbonate, a polyester, or a polyester carbonate each containing the above-described specified structural unit can be suitably used. The resin having such a constitution is excellent in heat resistance, mechanical physical properties, melt processability, and the like and has such an advantage that by copolymerizing plural monomers, it is easy to control the optical properties of the retardation film to the desired ranges. As described later, the retardation film of the present invention may further contain, in addition to the above-described resin, other synthetic resins, additives, or the like, if desired.

It is preferred that the resin has at least one structural unit of the group consisting of a structural unit represented by the following general formula (1) and a structural unit represented by the following general formula (2) as the specified structural unit derived from the divalent oligofluorene. These structural units are hereinafter sometimes referred to as "oligofluorene structural unit".

[Chem. 4]

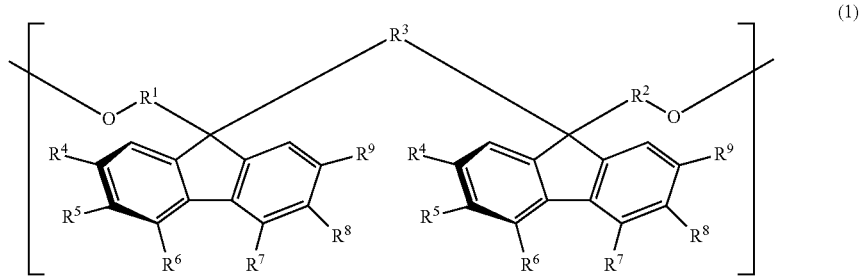

(1)

[Chem. 5]

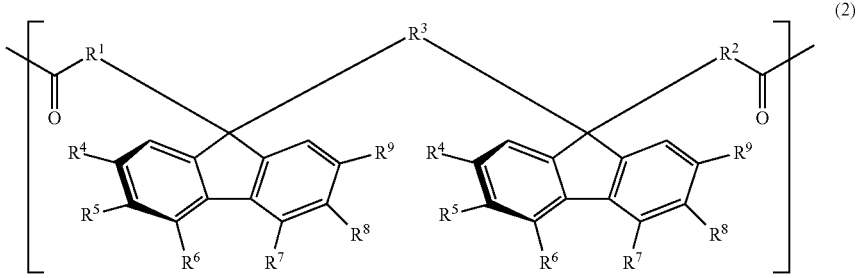

(2)

In the general formula (1) and the general formula (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring.

In $R^1$ and $R^2$, as the "alkylene group having a carbon number of from 1 to 4, which may have a substituent", for example, the following alkylene group may be employed: a linear alkylene group such as methylene group, ethylene group, n-propylene group, and n-butylene group; and an alkylene group having a branched chain, such as methylmethylene group, dimethylmethylene group, ethylmethylene group, propylmethylene group, (1-methylethyl)methylene group, 1-methylethylene group, 2-methylethylene group, 1-ethylethylene group, 2-ethylethylene group, 1-methylpropylene group, 2-methylpropylene group, 1,1-dimethylethylene group, 2,2-dimethylpropylene group, and 3-methylpropylene group. In $R^1$ and $R^2$, the position of a branched chain is indicated by a number assigned such that the carbon on the fluorene ring side becomes the $1^{st}$-position.

Selection of $R^1$ and $R^2$ has an important effect particularly on the development of reverse wavelength dispersion property. The resin above exhibits strongest reverse wavelength dispersion property in the state of fluorene rings being oriented perpendicularly to the main chain direction (stretching direction). In order to develop strong reverse wavelength dispersion property by approximation of the orientation state of fluorene rings to the state above, $R^1$ and $R^2$ in which the carbon number on the main chain of an alkylene group is from 2 to 3 are preferably employed. In the case where the carbon number is 1, unexpectedly, reverse wavelength dispersion property is not exhibited in some cases. The cause thereof is considered to be, for example, that orientation of fluorene rings is fixed in a direction not perpendicular to the main chain direction due to a steric hindrance of a carbonate group or an ester group, each of which is a linking group of the oligofluorene structural unit. On the other hand, in the case where the carbon number is too large, orientation of fluorene rings is weakly fixed and in turn, the reverse wavelength dispersion property may be weakened. Heat resistance of the resin is also reduced.

As shown in the general formula (1) and the general formula (2), one end of an alkylene group of $R^1$ and $R^2$ is bonded to a fluorene ring and the other end is bonded to either oxygen atom or carbonyl carbon contained in a linking group. In view of thermal stability, heat resistance and reverse wavelength dispersion property, the other end of the alkylene group is preferably bonded to carbonyl carbon. As described later, as a monomer having an oligofluorene structure, specifically, a diol or diester (hereinafter, the diester encompasses dicarboxylic acid) structure may be considered, but it is preferable to perform polymerization by using a diester as the raw material.

From the standpoint of facilitating the production, the same alkylene group is preferably employed for $R^1$ and $R^2$.

In $R^3$, as the "alkylene group having a carbon number of from 1 to 4, which may have a substituent", for example, the following alkylene group may be employed: a linear alkylene group such as methylene group, ethylene group, n-propylene group, and n-butylene group; and an alkylene group having a branched chain, such as methylmethylene group, dimethylmethylene group, ethylmethylene group, propylmethylene group, (1-methylethy)methylene group, 1-methylethylene group, 2-methylethylene group, 1-ethylethylene group, 2-ethylethylene group, 1-methylpropylene group, 2-methylpropylene group, 1,1-dimethylethylene group, 2,2-dimethylpropylene group, and 3-methylpropylene group.

In $R^3$, the carbon number on the main chain of an alkylene group is preferably from 1 to 2, and the carbon number is more preferably 1. In the case of employing $R^3$ where the carbon number on the main chain is too large, similarly to $R^1$ and $R^2$, the fluorene ring may be weakly fixed to cause deterioration of the reverse wavelength dispersion property, increase in the photoelastic coefficient, reduction in the heat resistance, or the like. On the other hand, in the case where the carbon number on the main chain is small, the optical properties or heat resistance may be good, but in the case where the $9^{th}$-positions of two fluorene rings are connected by a direct bond, the thermal stability deteriorates.

In $R^1$ to $R^3$, as the substituent which the alkylene group may have, substituents exemplified below may be employed, but a substituent other than these may also be employed: a halogen atom selected from fluorine atom, chlorine atom, bromine atom, and iodine atom; an alkoxy group having a carbon number of from 1 to 10, such as methoxy group and ethoxy group; an acyl group having a carbon number of from 1 to 10, such as acetyl group and benzoyl group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, the above-described acyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. In the case where the number of substituents is too large, it may inhibit the reaction during polymerization or may cause thermal decomposition. From the standpoint of enabling industrial production at low cost, $R^1$ and $R^3$ are preferably unsubstituted.

In $R^4$ to $R^9$, as the "alkyl group having a carbon number of from 1 to 10, which may have a substituent", for example, the following alkyl group may be employed: a linear alkyl group such as methyl group, ethyl group, n-propyl group, n-butyl group, n-pentyl group, n-hexyl group, and n-decyl group; an alkyl group having a branched chain, such as isopropyl group, 2-methylpropyl group, 2,2-dimethylpropyl group, and 2-ethylhexyl group; and a cyclic alkyl group such as cyclopropyl group, cyclopentyl group, cyclohexyl group, and cyclooctyl group.

The carbon number of the alkyl group is preferably 4 or less, and more preferably 2 or less. In the case of within this range, steric hindrance between fluorene rings hardly occurs, and desired optical properties derived from the fluorene ring tend to be obtained.

In $R^4$ to $R^9$, as the substituent which the alkyl group may have, substituents exemplified below may be employed, but a substituent other than these may also be employed: a halogen atom selected from fluorine atom, chlorine atom, bromine atom, and iodine atom; an alkoxy group having a carbon number of from 1 to 10, such as methoxy group and ethoxy group; an acyl group having a carbon number of from 1 to 10, such as acetyl group and benzoyl group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, the above-described acyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. In the case where the number of substituents is too large, it may inhibit the reaction during polymerization or may cause thermal decomposition. From the standpoint of enabling industrial production at low cost, $R^4$ to $R^9$ are preferably unsubstituted.

Specific examples of the alkyl group include a trifluoromethyl group, a benzyl group, a 4-methoxybenzyl group, and a methoxymethyl group.

In $R^4$ to $R^9$, as the "aryl group having a carbon number of from 4 to 10, which may have a substituent", for example, the following aryl group may be employed: an aryl group such as phenyl group, 1-naphthyl group and 2-naphthyl group; and a heteroaryl group such as 2-pyridyl group, 2-thienyl group and 2-furyl group.

The carbon number of the aryl group is preferably 8 or less, and more preferably 7 or less. Within this range, steric hindrance between fluorene rings hardly occurs, and desired optical properties derived from the fluorene ring tend to be obtained.

In $R^4$ to $R^9$, as the substituent which the aryl group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acyl group having a carbon number of from 1 to 10, such as acetyl group and benzoyl group; an acylamino group having a carbon number of from 1 to 10, such as acetamide group and benzoylamide group; a nitro group; and a cyano group. The number of substituents above is not particularly limited but is preferably from 1 to 3. In the case where two or more substituents are present, the kind of the substituents may be the same with or different from each other. From the standpoint of enabling industrial production at low cost, $R^4$ to $R^9$ are preferably unsubstituted.

Specific examples of the aryl group include a 2-methylphenyl group, a 4-methylphenyl group, a 3,5-dimethylphenyl group, a 4-benzoylphenyl group, a 4-methoxyphenyl group, a 4-nitrophenyl group, a 4-cyanophenyl group, a 3-trifluoromethylphenyl group, a 3,4-dimethoxyphenyl group, a 3,4-methylenedioxyphenyl group, a 2,3,4,5,6-pentafluorophenyl group, and a 4-methylfuryl group.

In $R^4$ to $R^9$, as the "acyl group having a carbon number of from 1 to 10, which may have a substituent", for example, the following acyl group may be employed: an aliphatic acyl group such as formyl group, acetyl group, propionyl group, 2-methylpropionyl group, 2,2-dimethylpropionyl group, and 2-ethylhexanoyl group; and an aromatic acyl group such as benzoyl group, 1-naphthylcarbonyl group, 2-naphthylcarbonyl group, and 2-furylcarbonyl group.

The carbon number of the acyl group is preferably 4 or less, and more preferably 2 or less. Within this range, steric hindrance between fluorene rings hardly occurs, and desired optical properties derived from the fluorene ring tend to be obtained.

In $R^4$ to $R^9$, a s the substituent which the acyl group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, an acyl group having a carbon number of from 1 to 10, such as acetyl group or benzoyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. From the standpoint of enabling industrial production at low cost, $R^4$ to $R^9$ are preferably unsubstituted.

Specific examples of the acyl group include a chloroacetyl group, a trifluoroacetyl group, a methoxyacetyl group, a phenoxyacetyl group, a 4-methoxybenzoyl group, a 4-nitrobenzoyl group, a 4-cyanobenzoyl group, and a 4-trifluoromethylbenzoyl group.

In $R^4$ to $R^9$, as the "alkoxy or aryloxy group, each of which has a carbon number of from 1 to 10 and may have a substituent", for example, the following alkoxy group and aryloxy group may be employed: an alkoxy group such as methoxy group, ethoxy group, isopropoxy group, tert-butoxy group, trifluoromethoxy group, and phenoxy group.

The carbon number of the alkoxy group and aryloxy group is preferably 4 or less, and more preferably 2 or less. Within this range, steric hindrance between fluorene rings hardly occurs, and desired optical properties derived from the fluorene ring tend to be obtained.

As the substituent which the alkoxy group and aryloxy group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, an acyl group having a carbon number of from 1 to 10, such as acetyl group or benzoyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. From the standpoint of enabling industrial production at low cost, $R^4$ to $R^9$ are preferably unsubstituted.

Specific examples of the alkoxy group and aryloxy group include a chloromethyl group, a bromomethyl group, a 2-bromoethyl group, a trifluoromethyl group, a methoxymethyl group, a methoxyethoxymethyl group, a 3-chlorophenoxy group, a 3-bromophenoxy group, a 4-chlorophenoxy group, a 3-chlorophenoxy group, a 4-chlorophenoxy group, a 3-bromophenoxy group, a 4-bromophenoxy group, and a 4-methoxyphenoxy group.

In $R^4$ to $R^9$, as the "acyloxy group having a carbon number of from 1 to 10, which may have a substituent", for example, the following acyloxy group may be employed: an aliphatic acyloxy group such as formyloxy group, acetyloxy group, propanoyloxy group, butanoyloxy group, acrylyloxy group, and methacrylyloxy group; and an aromatic acyloxy group such as benzoyloxy group.

The carbon number of the acyloxy group is preferably 4 or less, and more preferably 2 or less. Within this range, steric hindrance between fluorene rings hardly occurs, and desired optical properties derived from the fluorene ring tend to be obtained.

As the substituent which the acyloxy group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, an acyl group having a carbon number of from 1 to 10, such as acetyl group and benzoyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. From the standpoint of enabling industrial production at low cost, $R^4$ to $R^9$ are preferably unsubstituted.

Specific examples of the acyloxy group include a chloroacetyloxy group, a trifluoroacetyloxy group, a methoxyacetyloxy group, a phenoxyacetyloxy group, a 4-methoxybenzoyloxy group, a 4-nitrobenzoyloxy group, a 4-cyanobenzoyloxy group, and 4-trifluoromethylbenzoyloxy group.

In $R^4$ to $R^9$, as the specific structure of the "amino group which may have a substituent", for example, the following amino group may be employed, but an amino group other than these may also be employed: an amino group; an aliphatic amino group such as N-methylamino group, N,N-dimethylamino group, N-ethylamino group, N,N-diethylamino group, N,N-methylethylamino group, N-propylamino group, N,N-dipropylamino group, N-isopropylamino group, and N,N-diisopropylamino group; an aromatic amino group such as N-phenylamino group and N,N-diphenylamino group; an acylamino group such as formamide group, acetamide group, decanoylamide group, benzoylamide group, and chloroacetamide group; and an alkoxycarbonylamino group such as benzyloxycarbonylamino group and tert-butyloxycarbonylamino group.

As the amino group, it is preferable to employ an N,N-dimethylamino group, an N-ethylamino group or an N,N-diethylamino group, each of which is free of a proton of high acidity, has a small molecular weight and tends to enable an increase in the fluorene ratio, and an N,N-dimethylamino group is more preferably employed.

In $R^4$ to $R^9$, as the "vinyl or ethynyl group, each of which has a carbon number of from 1 to 10 and may have a substituent", for example, the following vinyl and ethynyl groups may be employed, but a vinyl group or the like other than these may also be employed: a vinyl group, a 2-methylvinyl group, a 2,2-dimethylvinyl group, a 2-phenylvinyl group, a 2-acetylvinyl group, a ethynyl group, a methylethynyl group, a tert-butylethynyl group, a phenylethynyl group, an acetylethynyl group, and a trimethylsilylethynyl group.

The carbon number of the vinyl group and the ethynyl group is preferably 4 or less. Within this range, steric hindrance between fluorene rings hardly occurs, and desired optical properties derived from the fluorene ring tend to be obtained. In addition, the fluorene ring conjugation length increases, and a stronger reverse wavelength dispersion property is thereby readily obtained.

In $R^4$ to $R^9$, as the "sulfur atom having a substituent", for example, the following sulfur-containing group may be employed, but a sulfur-containing group other than these may also be employed: a sulfo group; an alkylsulfonyl group such as methylsulfonyl group, ethylsulfonyl group, propylsulfonyl group, and isopropylsulfonyl group; an arylsulfonyl group such as phenylsulfonyl group and p-tolylsulfonyl group; an alkylsulfinyl group such as methylsulfinyl group, ethylsulfinyl group, propylsulfinyl group, and isopropylsulfinyl group; an arylsulfinyl group such as phenylsulfinyl group and p-tolylsulfonyl group; an alkylthio group such as methylthio group and ethylthio group; an arylthio group such as phenylthio group and p-tolylthio group; an alkoxysulfonyl group such as methoxysulfonyl group and ethoxysulfonyl group; an aryloxysulfonyl group such as phenoxysulfonyl group; an aminosulfonyl group; an alkylsulfonyl group such as N-methylaminosulfonyl group, N-ethylaminosulfonyl group, N-tert-butylaminosulfonyl group, N,N-dimethylaminosulfonyl group, and N,N-diethylaminosulfonyl group; and an arylaminosulfonyl group such as N-phenylaminosulfonyl group and N,N-diphenylaminosulfonyl group. The sulfo group may form a salt with lithium, sodium, potassium, magnesium, ammonium, or the like.

Among these sulfur-containing groups, it is preferable to employ a methylsulfinyl group, an ethylsulfinyl group or a phenylsulfinyl group, each of which is free of a proton of high acidity, has a small molecular weight and can increase the fluorene ratio, and a methylsulfinyl group is more preferably employed.

In $R^4$ to $R^9$, as the "silicon atom having a substituent", for example, the following silyl group may be employed: a trialkylsilyl group such as trimethylsilyl group and triethylsilyl group; and a trialkoxysilyl group such as trimethoxysilyl group and triethoxysilyl group. Among these, a trialkylsilyl group that can be stably treated is preferred.

In $R^4$ to $R^9$, as the "halogen atom", fluorine atom, chlorine atom, bromine atom, and iodine atom may be employed. Among these, it is preferable to employ fluorine atom, chlorine atom or bromine atom, each of which is relatively easily introduced and by virtue of the electron-withdrawing nature, tends to increase the reactivity of the $9^{th}$-position of fluorene, and chlorine atom and bromine atom are more preferably employed.

Adjacent two groups out of $R^4$ to $R^9$ may be linked to each other to form a ring. Specific examples thereof include a substituted fluorene structure having a skeleton exemplified in the following group [A].

[Chem. 6]
[A]

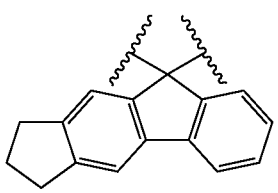
(A1)

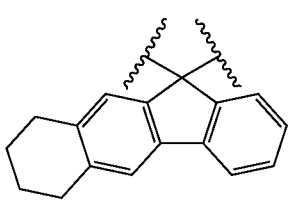
(A2)

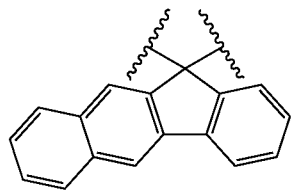
(A3)

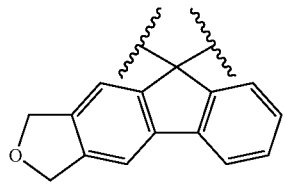
(A4)

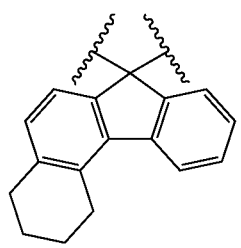
(A5)

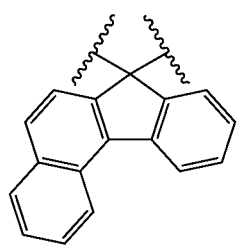
(A6)

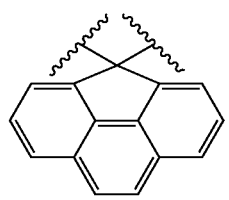
(A7)

As described above, in the case where $R^4$ to $R^9$ are a specific atom or substituent as described above, this leads to a tendency that steric hindrance between the main chain and a fluorene ring or between fluorene rings is less likely to occur and desired optical properties derived from the fluorene ring can be obtained.

The fluorene ring contained in the oligofluorene structural unit preferably has either a configuration where all of $R^4$ to $R^9$ are hydrogen atom, or a configuration where $R^4$ and/or $R^9$ are any member selected from the group consisting of a halogen atom, an acyl group, a nitro group, a cyano group, and a sulfo group and $R^5$ to $R^8$ are hydrogen atom. In the case of having the former configuration, a compound containing the oligofluorene structural unit can be derived from industrially inexpensive fluorene. In the case of having the latter configuration, the reactivity at the $9^{th}$-position of fluorene increases and therefore, various induced reactions tend to be applicable in the course of synthesizing a compound containing the oligofluorene structural unit. The fluorene ring more preferably has either a configuration where all of $R^4$ to $R^9$ are hydrogen atom, or a configuration where $R^4$ and/or $R^9$ are any member selected from the group consisting of fluorine atom, chlorine atom, bromine atom, and a nitro group and $R^5$ to $R^8$ are hydrogen atom, and still more preferably a configuration where all of $R^4$ to $R^9$ are hydrogen atom. By employing this configuration, the fluorene ratio can be increased, steric hindrance between fluorene rings hardly occurs, and desired optical properties derived from the fluorene ring tend to be obtained.

Of divalent oligofluorene structural units represented by the general formula (1) and the general formula (2), preferable structures specifically include a structure having a skeleton exemplified in the following group [B].

[Chem. 7]
[B]

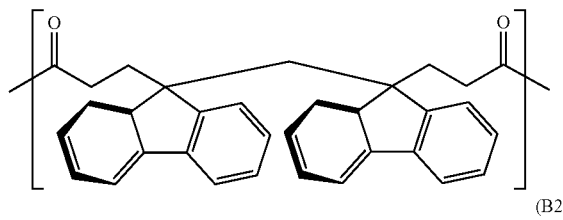

(B1)

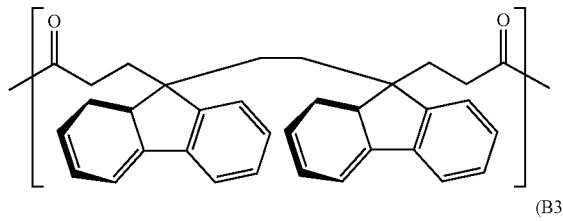

(B2)

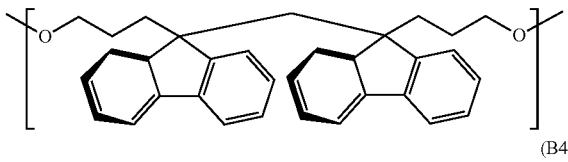

(B3)

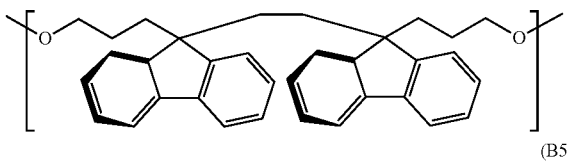

(B4)

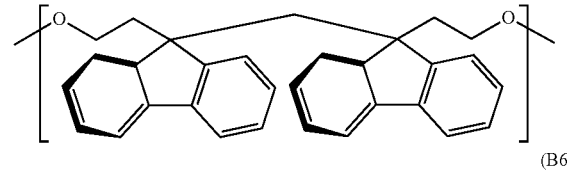

(B5)

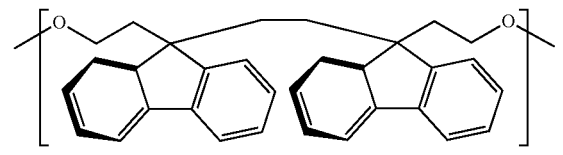

(B6)

Compared with a structural unit (the following structural formula (9)) derived from 9,9-bis[4-(2-hydroxyethoxy)phenyl]fluorene or a structural unit (the following structural formula (10)) derived from 9,9-bis(4-hydroxy-3-methylphenyl)fluorene, which have been conventionally often used, the oligofluorene structural unit has the following characteristics.

- An aromatic component such as phenyl ring that has been conventionally incorporated into the main chain of a polymer is not incorporated into the main chain of a polymer, so that the photoelastic coefficient can be decreased.
- Since the aromatic component above incorporated into the main chain exhibits a positive wavelength dispersion property of increasing in the birefringence as the wavelength is shorter, the reverse wavelength dispersion property derived from a fluorene ring in the side chain has been conventionally canceled to decrease the reverse wavelength dispersion property of the resin as a whole. In contrast, no aromatic component is incorporated into the main chain, whereby the reverse wavelength dispersion property can be more strongly developed.
- Two fluorene rings are introduced per one molecule, whereby high heat resistance can be imparted.
- The main chain is composed of a flexible alkylene chin, so that flexibility and melt processability can be imparted to the resin.

[Chem. 8]

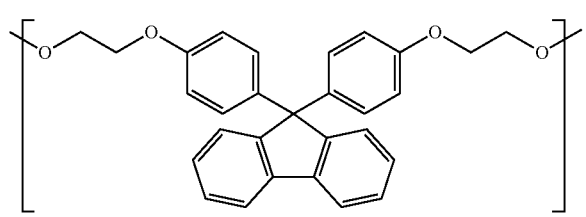

(9)

[Chem. 9]

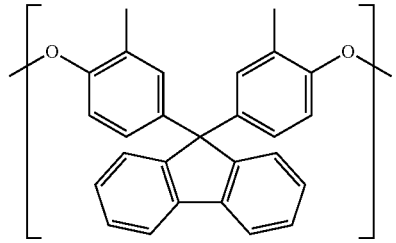

(10)

The method for introducing the oligofluorene structural unit into the resin includes, for example, a method of copolymerizing a diol or diester having the oligofluorene structural unit with another diol or diester. Specifically, a polycarbonate can be obtained by performing polymerization by using a combination of a diol and a carbonic acid diester represented by the following formula general (11). A polyester can be obtained by performing polymerization by using a combination of a diol and a diester. A polyester carbonate can be obtained by performing polymerization by using a combination of a diol, a diester, and a carbonic acid diester.

[Chem. 10]

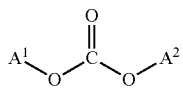
(11)

In the general formula (11), each of $A^1$ and $A^2$ is an aliphatic hydrocarbon group having a carbon number of from 1 to 18, which may have a substituent, or an aromatic hydrocarbon group which may have a substituent, and $A^1$ and $A^2$ may be the same with or different from each other.

The monomer having the oligofluorene structural unit includes, for example, a specific diol represented by the following general formula (12) and a specific diester represented by the following general formula (13):

[Chem. 11]

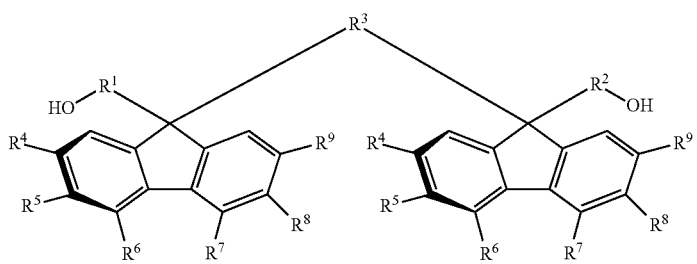
(12)

[Chem. 12]

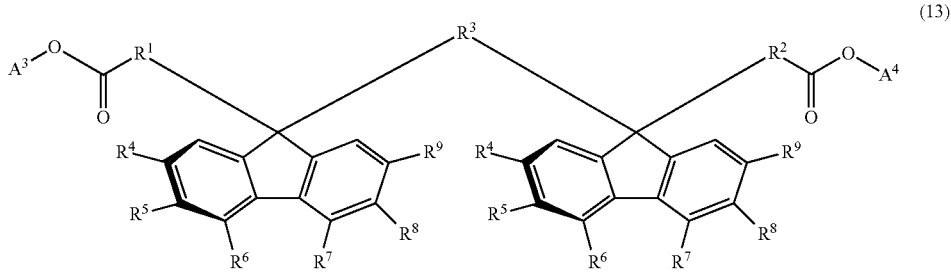
(13)

In the general formula (12) and the general formula (13), each of $R^1$ to $R^3$ is independently a direct bond or an alkylene group having a carbon number of from 1 to 4, which may have a substituent; each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring; and $A^3$ and $A^4$ are hydrogen atom, an aliphatic hydrocarbon group having a carbon number of from 1 to 18, each of which may have a substituent, or an aromatic hydrocarbon group which may have a substituent, and $A^3$ and $A^4$ may be the same with or different from each other.

As the monomer having the divalent oligofluorene structural unit, the specific diester represented by the general formula (13) is preferably used. The specific diester has relatively good thermal stability as compared with the specific diol represented by the general formula (12), and fluorene rings in the polymer tend to be oriented in a preferable direction to exhibit a stronger reverse wavelength dispersion property.

On the other hand, when a polycarbonate and a polyester are compared, a polycarbonate obtained by the polymerization of a diol and a carbonic acid diester tends to be more well-balanced between heat resistance and mechanical properties. Accordingly, the resin used for the retardation film of the present invention is, among others, particularly preferably a polyester carbonate in which the above-described specific diester having an oligofluorene structural unit is incorporated into the structure of a polycarbonate.

In the case where $A^3$ and $A^4$ of the general formula (13) is hydrogen atom or an aliphatic hydrocarbon group such as methyl group or ethyl group, it is sometimes difficult to cause a polymerization reaction under usually-employed polymerization conditions of a polycarbonate. For this reason, $A^3$ and $A^4$ of the general formula (13) are preferably an aromatic hydrocarbon group.

In the case of performing a polymerization reaction by using the carbonic acid diester represented by the general formula (11), if all of $A^1$ and $A^2$ of the general formula (11) and $A^3$ and $A^4$ of the general formula (13) have the same structure, the components desorbing during the polymerization reaction are identical and are therefore easily recovered and recycled. Above all, in view of polymerization reactivity and usefulness in recycling, $A^1$ to $A^4$ are particularly preferably a phenyl group. In the case where $A^1$ to $A^4$ are a phenyl group, the component desorbing during the polymerization reaction is phenol.

In the retardation film of the present invention, in order to obtain positive refractive index anisotropy and satisfactory reverse wavelength dispersion properties, it is necessary to blend a component having positive refractive index anisotropy and a component having negative refractive index anisotropy and having large wavelength dispersion (wavelength dependence) of refractive index in an appropriate ratio. Examples of the method of adjusting such a ratio include a method of copolymerizing a monomer having positive refractive index anisotropy and a monomer having negative refractive index anisotropy; and a method of blending a resin having positive refractive index anisotropy and a resin having negative refractive index anisotropy. The method of synthesizing a resin through copolymerization is preferred from the standpoints that the contents of the respective components can be accurately controlled, high transparency is obtained, and uniform characteristics are obtained over the whole of the film.

A lot of components constituting versatile linear polymers have positive refractive index anisotropy. Examples of components having positive refractive index anisotropy include components constituting polyethylene, polypropylene, cycloolefin polymer, polycarbonate, polyester, nylon, and the like. Examples of components having negative refractive index anisotropy include components containing an aromatic structure oriented in a direction approximately vertically relative to the main chain, such as 9,9-bis[4-(2-hydroxyethoxy)phenyl]fluorene, 9,9-bis(4-hydroxy-3-methylphenyl)fluorene, polystyrene, monomers represented by the general formula (12) and the general formula (13).

In the case of using monomers represented by the general formula (12) and the general formula (13), the content of the oligofluorene structural unit in the resin is, relative to the entire resin, preferably 1 mass % or more and 40 mass % or less, more preferably 10 mass % or more and 35 mass % or less, still more preferably 15 mass % or more and 30 mass % or less, and yet still more preferably 18 mass % or more and 25 mass % or less. In the case where the content of the oligofluorene structural unit is too large, it is considered that the reverse wavelength dispersion properties of the fluorene ring become insufficient, and the photoelastic coefficient or reliability may be deteriorated or a high refractive index may not be obtained by stretching. In addition, since the proportion of the oligofluorene structural unit occupying in the resin is increased and the width of molecular design latitude is narrow, it becomes difficult to make improvement when reforming of the resin is required. On the other hand, even if a desired reverse wavelength dispersion property is obtained with a very small amount of the oligofluorene structural unit, optical properties are here sensitively changed depending on a slight variation of the oligofluorene content and therefore, it is difficult to produce it such that various properties fall in given ranges.

In the above-described resin, dihydroxy compounds or diester compounds as exemplified below can be used in addition to the monomers represented by the general formula (12) and the general formula (13).

In the present invention, in view of optical properties, mechanical properties, heat resistance, or the like, the resin preferably contains, as a copolymerization component, a structural unit of the following general formula (3):

[Chem. 13]

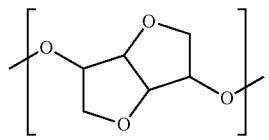

(3)

As the dihydroxy compound, into which the structural unit represented by the general formula (3) can be introduced, there may be mentioned isosorbide (ISB), isomannide and isoidide, which are in a stereoisomeric relationship. One of them may be used alone, or two or more thereof may be used in combination. Among these, use of ISB is most preferred in view of the availability and polymerization reactivity.

The structural unit represented by the general formula (3) is preferably contained, in the resin, in an amount of 5 mass % or more and 70 mass % or less, more preferably 10 mass % or more and 65 mass % or less, and still more preferably 20 mass % or more and 60 mass % or less. In the case where the content of the structural unit represented by the general formula (3) is too small, the heat resistance may be insufficient. On the other hand, in the case where the content of the structural unit represented by the general formula (3) is too large, the heat resistance may become excessively high to deteriorate the mechanical properties or melt processability. In addition, the structural unit represented by the general formula (3) is a highly hygroscopic structure and if the content thereof is excessively large, the water absorption percentage of the resin is increased, raising a fear that dimensional deformation occurs under a high-humidity environment.

In the present invention, the resin may further contain a different structural unit (hereinafter, such a structural unit is sometimes referred to as "other structural unit"), in combination with the structural unit of the general formula (3) or without using the structure of the general formula (3).

As the other structural unit, it is particularly preferable to have a structural unit represented by the following general formula (4) to (8) containing no aromatic component.

[Chem. 14]

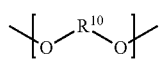

(4)

In the general formula (4), $R^{10}$ represents an alkylene group having a carbon number of from 2 to 20, which may have a substituent.

As the dihydroxy compound into which the structural unit of the general formula (4) can be introduced, for example, the following dihydroxy compound may be employed: a dihydroxy compound of a linear aliphatic hydrocarbon, such as ethylene glycol, 1,3-propanediol, 1,2-propanediol, 1,4-butanediol, 1,3-butanediol, 1,2-butanediol, 1,5-heptanediol, 1,6-hexanediol, 1,9-nonanediol, 1,10-decanediol, and 1,12-dodecanediol; and a dihydroxy compound of a branched aliphatic hydrocarbon, such as neopentyl glycol and hexylene glycol.

[Chem. 15]

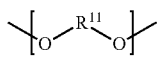

(5)

In the general formula (5), represents a cycloalkylene group having a carbon number of from 4 to 20, which may have a substituent.

As the dihydroxy compound into which the structural unit of the general formula (5) can be introduced, for example, the following dihydroxy compound may be employed: a dihydroxy compound as a secondary alcohol or tertiary alcohol of an alicyclic hydrocarbon, such as 1,2-cyclohexanediol, 1,4-cyclohexanediol, 1,3-adamantanediol, hydrogenated bisphenol A, and 2,2,4,4-tetramethyl-1,3-cyclobutanediol.

[Chem. 16]

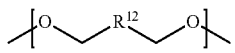

(6)

In the general formula (6), $R^{12}$ represents a cycloalkylene group having a carbon number of from 4 to 20, which may have a substituent.

As the dihydroxy compound into which the structural unit of the general formula (6) can be introduced, for example, the following dihydroxy compound may be employed: a dihydroxy compound as a primary alcohol of an alicyclic hydrocarbon, exemplified by a dihydroxy compound derived from a terpene compound, such as 1,2-cyclohexanedimethanol, 1,3-cyclohexanedimethanol, 1,4-cyclohexanedimethanol, tricyclodecanedimethanol, pentacyclopentadecanedimethanol, 2,6-decalindimethanol, 1,5-decalindimethanol, 2,3-decalindimethanol, 2,3-norbornanedimethanol, 2,5-norbornanedimethanol, 1,3-adamantanedimethanol, and limonene.

[Chem. 17]

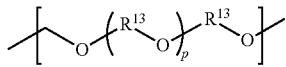

(7)

In the general formula (7), $R^{13}$ represents an alkylene group having a carbon number of from 2 to 10, which may have a substituent, and p is an integer of from 1 to 40.

As the dihydroxy compound into which the structural unit of the general formula (7) can be introduced, for example, the following dihydroxy compound may be employed: oxyalkylene glycols such as diethylene glycol, triethylene glycol, tetraethylene glycol, polyethylene glycol, and polypropylene glycol.

[Chem. 18]

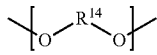

(8)

In the general formula (8), $R^{14}$ represents a group containing an acetal ring having a carbon number of from 2 to 20, which may have a substituent.

As the dihydroxy compound into which the structural unit of the general formula (8) can be introduced, for example, a spiroglycol represented by the following structural formula (14), a dioxane glycol represented by the following structural formula (15) or the like may be employed:

[Chem. 19]

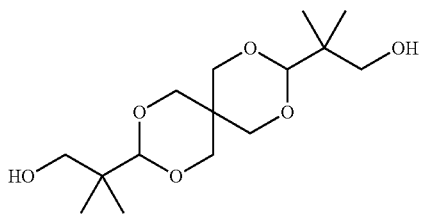

(14)

[Chem. 20]

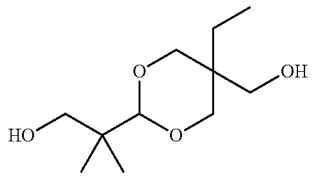

(15)

Other than the above-described dihydroxy compounds, a dihydroxy compound containing an aromatic component, exemplified below, may be used: an aromatic bisphenol compound such as 2,2-bis(4-hydroxyphenyl)propane, 2,2-bis(3-methyl-4-hydroxyphenyl)propane, 2,2-bis(4-hydroxy-3,5-dimethylphenyl)propane, 2,2-bis(4-hydroxy-3,5-diethylphenyl)propane, 2,2-bis(4-hydroxy-(3-phenyl)phenyl)propane, 2,2-bis(4-hydroxy-(3,5-diphenyl)phenyl)propane, 2,2-bis(4-hydroxy-3,5-dibromophenyl)propane, bis(4-hydroxyphenyl)methane, 1,1-bis(4-hydroxyphenyl)ethane, 2,2-bis(4-hydroxyphenyl)butane, 2,2-bis(4-hydroxyphenyl)pentane, 1,1-bis(4-hydroxyphenyl)-1-phenylethane, bis(4-hydroxyphenyl)diphenylmethane, 1,1-bis(4-hydroxyphenyl)-2-ethylhexane, 1,1-bis(4-hydroxyphenyl)decane, bis(4-hydroxy-3-nitrophenyl)methane, 3,3-bis(4-hydroxyphenyl)pentane, 1,3-bis(2-(4-hydroxyphenyl)-2-propyl)benzene, 1,3-bis(2-(4-hydroxyphenyl)-2-propyl)benzene, 2,2-bis(4-hydroxyphenyl)hexafluoropropane, 1,1-bis(4-hydroxyphenyl)cyclohexane, bis(4-hydroxyphenyl)sulfone, 2,4'-dihydroxydiphenylsulfone, bis(4-hydroxyphenyl)sulfide, bis(4-hydroxy-3-methylphenyesulfide, bis(4-hydroxyphenyl)disulfide, 4,4'-dihydroxydiphenyl ether, and 4,4'-dihydroxy-3,3'-dichlorodiphenyl ether; a dihydroxy compound having an ether group bonded to an aromatic group, such as 2,2-bis(4-(2-hydroxyethoxy)phenyl)propane, 2,2-bis(4-(2-hydroxypropoxy)phenyl)propane, 1,3-bis(2-hydroxyethoxy)benzene, 4,4'-bis(2-hydroxyethoxy)biphenyl, and bis(4-(2-hydroxyethoxy)phenyl)sulfone; and a dihydroxy compound having a fluorene ring, such as 9,9-bis(4-(2-hydroxyethoxy)phenyl)fluorene, 9,9-bis(4-hydroxyphenyl)fluorene, 9,9-bis(4-hydroxy-3-methylphenyl)fluorene, 9,9-bis(4-(2-hydroxypropoxy)phenyl)fluorene, 9,9-bis(4-(2-hydroxyethoxy)-3-methylphenyl)fluorene, 9,9-bis(4-(2-hydroxypropoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2- hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene.

As the diester compound which can be used for the copolymerization of the above-described resin, for example, the following dicarboxylic acid or the like may be employed: an aromatic dicarboxylic acid such as terephthalic acid, phthalic acid, isophthalic acid, 4,4'-diphenyldicarboxylic acid, 4,4'-diphenylether dicarboxylic acid, 4,4'-benzophenone dicarboxylic acid, 4,4'-diphenoxyethane dicarboxylic acid, 4,4'-diphenylsulfone dicarboxylic acid, and 2,6-naphthalenedicarboxylic acid; an alicyclic dicarboxylic acid such as 1,2-cyclohexanedicarboxylic acid, 1,3-cyclohexanedicarboxylic acid and 1,4-cyclohexanedicarboxylic acid; and an aliphatic dicarboxylic acid such as malonic acid, succinic acid, glutaric acid, adipic acid, pimelic acid, suberic acid, azelaic acid, and sebacic acid. These dicarboxylic acid components may be used as a dicarboxylic acid itself for the raw material of the polyester carbonate above, but according to the production method, a dicarboxylic acid ester such as methyl ester form and phenyl ester form or a dicarboxylic acid derivative such as dicarboxylic acid halide may also be used for the raw material.

In view of optical properties, among the other structural units recited above, those containing no aromatic component are preferably used. In the case where an aromatic component is contained in the main chain of the polymer, as described above, the reverse wavelength dispersion property of the fluorene ring is canceled, and the content of the oligofluorene structural unit must be increased, or the photoelastic coefficient may be deteriorated. By employing the other structural unit containing no aromatic component, an aromatic component can prevented from being incorporated into the main chain from the structural unit.

On the other hand, for providing a balance with heat resistance, mechanical properties or the like while ensuring optical properties, it is sometimes effective to incorporate an aromatic component into the main chain or side chain of the polymer. In this case, for example, the aromatic component can be introduced into the polymer by the above-described other structural unit containing an aromatic component.

In view of balance of various properties, the content of a structural unit containing an aromatic group (excluding a structural unit represented by the general formula (1) and a structural unit represented by the general formula (2)) in the resin is preferably 5 mass % or less, and more preferably 3 mass % or less.

As a monomer having the other structural unit above, it is particularly preferable to employ 1,4-cyclohexanedimethanol, tricyclodecanedimethanol, spiroglycol, or 1,4-cyclohexanedicarboxylic acid (or their derivatives). A resin containing a structural unit derived from such a monomer is excellent in the balance of optical properties, heat resistance, mechanical properties, and the like The diester compound has relatively low polymerization reactivity. Therefore, in the case of synthesizing a polyester carbonate by using the specified diester represented by the general formula (13), from the viewpoint of increasing the reaction efficiency, it is preferred that a diester other than the above-described specified diester is not used as the monomer to be copolymerized.

As to the dihydroxy compound or diester compound for introducing the other structural unit, depending on the performance required of the resin obtained, it may be used alone, or two or more kinds thereof may be used in combination. The content of the other structural unit in the resin is preferably 1 mass % or more and 60 mass % or less, more preferably from 5 mass % or more and 55 mass % or less, and still more preferably from 10 mass % or more and 50 mass % or less. The other structural unit assumes a role of particularly adjusting the heat resistance of the resin or imparting flexibility or toughness, and therefore, if the content is too small, the mechanical properties or melt processability of the resin may be deteriorated, whereas if the content is too large, the heat resistance or optical properties may be deteriorated.

<Production Method of Resin Used in the Present Invention>

The polycarbonate, polyester and polyester carbonate that are used in the present invention can be produced by a polymerization method used in general. More specifically, the resin can be produced by a solution polymerization method or interfacial polymerization method using phosgene or a carboxylic acid halide, or a melt polymerization method of performing a reaction without using a solvent. Among these production methods, it is preferably produced by a melt polymerization method which does not use a solvent or a highly toxic compound and therefore, can reduce the environmental load and which is excellent in the productivity.

In the case of using a solvent for the polymerization, the glass transition temperature of the resin decreases due to a plasticizing effect of the solvent remaining in the resin, making it difficult to control the molecular orientation to a constant orientation in the later-described stretching step. In the case where a halogen-based organic solvent such as methylene chloride remains in the resin, when a formed product using this resin is incorporated into electronic equipment or the like, it may cause corrosion. A resin obtained by a melt polymerization method does not contain a solvent and is advantageous also for the processing step or the stabilization of product quality.

At the time of producing the above-described resin by the melt polymerization method, monomers used as raw material and a polymerization catalyst are mixed and subjected to a transesterification reaction under melting, and the rate of reaction is increased by removing the desorbed components outside the system. In the latter stage of polymerization, the reaction is caused to proceed under high-temperature high-vacuum conditions until a target molecular weight is reached. When the reaction is completed, the resin in a molten state is withdrawn from the reactor to obtain a resin raw material for use in the retardation film.

The carbonic acid diester for use in the polycondensation reaction includes, usually, those represented by the above-mentioned general formula (11). One of these carbonic acid diesters may be used alone, or two or more thereof may be mixed and used.

[Chem. 21]

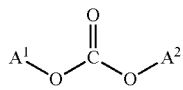

(11)

In the general formula (11), each of $A^1$ and $A^2$ is an aliphatic hydrocarbon group having a carbon number of from 1 to 18, which may have a substituent, or an aromatic hydrocarbon group which may have a substituent, and A$^1$ and A$^2$ may be the same with or different from each other.

Each of A$^1$ and A$^2$ is preferably a substituted or unsubstituted aromatic hydrocarbon group, and more preferably an unsubstituted aromatic hydrocarbon group. The substituent on the aliphatic hydrocarbon group includes an ester group, an ether group, a carboxylic acid, an amide group, and a halogen, and the substituent on the aromatic hydrocarbon group includes an alkyl group such as methyl group and ethyl group.

The carbonic acid diester represented by the general formula (11) includes, for example, diphenyl carbonate (DPC), a substituted diphenyl carbonate such as ditolyl carbonate, dimethyl carbonate, diethyl carbonate, and di-tert-butyl carbonate. Among these, diphenyl carbonate and a substituted diphenyl carbonate are preferred, and diphenyl carbonate is more preferred. The carbonic acid diester sometimes contains an impurity such as chloride ion, and it may inhibit the polymerization reaction or impair the hue of the obtained polycarbonate. Therefore, it is preferable to use one that has been purified by distillation or the like as needed.

In the polycondensation reaction, the molar proportion of all dihydroxy compounds and a diester compound used for the reaction is strictly adjusted, whereby the reaction rate or the molecular weight of the resin obtained can be controlled. In the case of a polycarbonate, the molar proportion of a carbonic acid diester relative to all dihydroxy compounds is preferably adjusted to be from 0.90 to 1.10, more preferably adjusted to be from 0.96 to 1.05, and still more preferably adjusted to be from 0.98 to 1.03. In the case of a polyester, the molar proportion of all diester compounds relative to all dihydroxy compounds is preferably adjusted to be from 0.70 to 1.10, more preferably adjusted to be from 0.80 to 1.05, and still more preferably adjusted to be from 0.85 to 1.00. In the case of a polyester carbonate, the molar proportion of the total amount of a carbonic acid diester and all diester compounds relative to all dihydroxy compounds is preferably adjusted to be from 0.90 to 1.10, more preferably adjusted to be from 0.96 to 1.05, and still more preferably adjusted to be from 0.98 to 1.03.

If the molar proportion greatly deviates from the range above, a resin having a desired molecular weight cannot be produced. Furthermore, in the case where the molar proportion is too small, the number of terminal hydroxy groups of the resin produced may be increased to deteriorate the thermal stability of the resin. In the case where the molar proportion is too large, the transesterification reaction rate may be reduced under the same conditions, or the amount of the remaining carbonic acid diester or diester compound in the produced resin may be increased, and the remaining low molecular compound may volatilize during film production or stretching to produce a film defect.

The melt polymerization method is usually carried out by a multistage process of two or more stages. The polycondensation reaction may be carried out by a process of two or more stages by using one polymerization reactor and sequentially changing the conditions, or may be carried out by a process of two or more stages by using two or more reactors and changing respective conditions, but in view of production efficiency, it is preferable to carrying out by using two or more, preferably three or more reactors. The polycondensation reaction may be any of a batch reaction, a continuous reaction, and a combination of a batch reaction and a continuous reaction, but in view of production efficiency and quality stability, a continuous reaction is preferred.

In the polycondensation reaction, it is important to properly control the balance between temperature and pressure in the reaction system. If either one of the temperature and the pressure is changed too early, unreacted monomers is distilled out of the reaction system, as a result, the molar proportion of a dihydroxy compound and diester compound may be changed, failing in obtaining a resin having a desired molecular weight.

The polymerization rate of the polycondensation reaction is controlled by the balance between a terminal hydroxy group and a terminal ester group or a terminal carbonate group. Particularly, in the case of performing the polymerization by a continuous reaction, if the balance of terminal groups fluctuates due to distillation of unreacted monomers, the polymerization rate can be hardly controlled to a constant rate, and fluctuation in the molecular weight of the obtained resin may be increased. The molecular weight of the resin is correlated with the melt viscosity and therefore, the melt viscosity fluctuates at the time of melt film production of the obtained resin, as a result, the film can hardly keep the quality such as film thickness constant, which in turn causes reduction in the quality or productivity of the film.

Furthermore, in the case where unreacted monomers are distilled out, in addition to the balance of terminal groups, the copolymerization composition of the resin deviates from a desired composition, which may affect also the optical quality of the retardation film. In the retardation film of the present invention, the later-described wavelength dispersion property of retardation is controlled by the proportion of the respective structural units in the resin and when the proportion is lost during polymerization, optical properties as designed may not be obtained or in the case of obtaining a long film, the optical properties may be changed depending on the position of the film, making it impossible to produce a polarizing plate having a constant quality.

Specifically, as the reaction conditions in the first-stage reaction, the following conditions may be employed. That is, the maximum inner temperature of the polymerization reactor is set in the range of usually 130° C. or more, preferably 150° C. or more and more preferably 170° C. or more, and usually 250° C. or less, preferably 240° C. or less and more preferably 230° C. or less. The pressure of the polymerization reactor is set in the range of usually 70 kPa or less (hereinafter, the pressure indicates an absolute pressure), preferably 50 kPa or less and more preferably 30 kPa or less, and usually 1 kPa or more, preferably 3 kPa or more and more preferably 5 kPa or more. The reaction time is set in the range of usually 0.1 hours or more and preferably 0.5 hours or more, and usually 10 hours or less, preferably 5 hours or less and more preferably 3 hours or less. The first-stage reaction is carried out while distilling a occurring monohydroxy compound derived from diester compound outside the reaction system. For example, in the case of using diphenyl carbonate as the carbonic acid diester, the monohydroxy compound distilled outside the reaction system in the first-stage reaction is phenol.

In the first-stage reaction, as the reaction pressure is lower, the polymerization reaction can be accelerated but, on the other hand, a distillation loss of unreacted monomers increases. In order to achieve both suppressing the distillation of unreacted monomers and accelerating the reaction by pressure reduction, it is effective to use a reactor equipped with a reflux condenser. In particular, the reflux condenser is preferably used in the initial stage of reaction, where the amount of unreacted monomers is large.

In and after the second stage, the pressure in the reaction system is gradually reduced from the pressure in the first stage and while removing the continuously occurring monohydroxy compound outside the reaction system, the pressure of the reaction system is finally reduced to 5 kPa or less, preferably 3 kPa or less, and more preferably 1 kPa or less. The maximum inner temperature is set in the range of usually 210° C. or more and preferably 220° C. or more, and usually 270° C. or less and preferably 260° C. or less. The reaction time is set in the range of usually 0.1 hours or more, preferably 0.5 hours or more and more preferably 1 hour or more, and usually 10 hours or less, preferably 5 hours or less and more preferably 3 hours or less. In order to suppress coloring or thermal deterioration and to obtain a resin with good hue or thermal stability, it is good to set the maximum inner temperature in all reaction stages being 270° C. or less, preferably 260° C. or less and more preferably 250° C. or less.

The transesterification reaction catalyst (hereinafter, sometimes simply referred to as a catalyst or a polymerization catalyst) which may be used at the polymerization may have a very large effect on the reaction rate or the color tone or thermal stability of a resin obtained by polycondensation. The catalyst used is not particularly limited as long as the produced resin can be satisfied with transparency, hue, heat resistance, thermal stability, and mechanical strength. Examples thereof include a compound of a metal belonging to Group 1 or Group 2 of the long-form periodic table (hereinafter, simply referred to as "Group 1" or "Group 2"), and a basic compound such as basic boron compound, basic phosphorus compound, basic ammonium compound, and amine-based compound. A compound of at least one metal selected from the group consisting of metals belonging to Group 2 of the long-form periodic table and lithium is preferably used.

As the Group 1 metal compound, for example, the following compounds may be employed, but a Group 1 metal compound other than these may also be employed: sodium hydroxide, potassium hydroxide, lithium hydroxide, cesium hydroxide, sodium hydrogencarbonate, potassium hydrogencarbonate, lithium hydrogencarbonate, cesium hydrogencarbonate, sodium carbonate, potassium carbonate, lithium carbonate, cesium carbonate, sodium acetate, potassium acetate, lithium acetate, cesium acetate, sodium stearate, potassium stearate, lithium stearate, cesium stearate, sodium borohydride, potassium borohydride, lithium borohydride, cesium borohydride, sodium tetraphenylborate, potassium tetraphenylborate, lithium tetraphenylborate, cesium tetraphenylborate, sodium benzoate, potassium benzoate, lithium benzoate, cesium benzoate, disodium hydrogenphosphate, dipotassium hydrogenphosphate, dilithium hydrogenphosphate, dicesium hydrogenphosphate, disodium phenylphosphate, dipotassium phenylphosphate, dilithium phenylphosphate, dicesium phenylphosphate, alcoholates and phenolates of sodium, potassium, lithium, and cesium, and disodium salt, dipotassium salt, dilithium salt, and dicesium salt of bisphenol A. Among these, in view of polymerization activity and hue of the obtained polycarbonate, use of a lithium compound is preferred.

As the Group 2 metal compound, for example, the following compounds may be employed, but a Group 2 metal compound other than these may also be employed: calcium hydroxide, barium hydroxide, magnesium hydroxide, strontium hydroxide, calcium hydrogencarbonate, barium hydrogencarbonate, magnesium hydrogencarbonate, strontium hydrogencarbonate, calcium carbonate, barium carbonate, magnesium carbonate, strontium carbonate, calcium acetate, barium acetate, magnesium acetate, strontium acetate, calcium stearate, barium stearate, magnesium stearate, and strontium stearate. Among these, a magnesium compound, a calcium compound and a barium compound are preferably used. In view of polymerization activity and hue of the obtained polycarbonate, use of a magnesium compound and/or a calcium compound is more preferred, and use of a calcium compound is most preferred.

Together with the Group 1 metal compound and/or the Group 2 metal compound, a basic compound such as basic boron compound, basic phosphorus compound, basic ammonium compound, and amine-based compound, may be secondarily used in combination, but it is particularly preferable to use a compound of at least one metal selected from the group consisting of metals belonging to Group 2 of the long-form periodic table and lithium.

As the basic phosphorus compound, for example, the following compounds may be employed, but a basic phosphorus compound other than these may also be employed: triethylphosphine, tri-n-propylphosphine, triisopropylphosphine, tri-n-butylphosphine, triphenylphosphine, tributylphosphine, and a quaternary phosphonium salt.

As the basic ammonium compound, for example, the following compounds may be employed, but a basic ammonium compound other than these may also be employed: tetramethylammonium hydroxide, tetraethylammonium hydroxide, tetrapropylammonium hydroxide, tetrabutylammonium hydroxide, N,N,N-trimethylethanolamine (choline), trimethylethylammonium hydroxide, trimethylbenzylammonium hydroxide, trimethylphenylammonium hydroxide, triethylmethylammonium hydroxide, triethylbenzylammonium hydroxide, triethylphenylammonium hydroxide, tributylbenzylammonium hydroxide, tributylphenylammonium hydroxide, tetraphenylammonium hydroxide, benzyltriphenylammonium hydroxide, methyltriphenylammonium hydroxide, and butyltriphenylammonium hydroxide.

As the amine-based compound, for example, the following compounds may be employed, but an amine-based compound other than these may also be employed: 4-aminopyridine, 2-aminopyridine, N,N-dimethyl-4-aminopyridine, 4-diethylaminopyridine, 2-hydroxypyridine, 2-methoxypyridine, 4-methoxypyridine, 2-dimethylaminoimidazole, 2-methoxyimidazole, imidazole, 2-mercaptoimidazole, 2-methylimidazole, aminoquinoline, and guanidine.

The amount of the polymerization catalyst used is usually from 0.1 μmol to 300 μmol and preferably from 0.5 μmol to 100 μmol, per 1 mol of all dihydroxy compounds used for the polymerization. As the polymerization catalyst, in the case of using a compound of at least one metal selected from the group consisting of metals belonging to Group 2 of the long-form periodic table and lithium, particularly, in the case of using a magnesium compound and/or a calcium compound, the polymerization catalyst is usually used in an amount of, in terms of the metal amount, 0.1 μmol or more, preferably 0.3 μmol or more and more preferably 0.5 μmol or more, per 1 mol of all dihydroxy compounds above. The amount of the polymerization catalyst used is preferably 30 μmol or less, preferably 20 μmol or less and more preferably 10 μmol or less.

In the case of producing a polyester or a polyester carbonate by using a diester compound as the monomer, a transesterification catalyst such as titanium compound, tin compound, germanium compound, antimony compound, zirconium compound, lead compound, osmium compound, zinc compound, and manganese compound, can also be used, in combination with or not in combination with the above-described basic compound. The transesterification catalyst is usually used in an amount of, in terms of the metal amount, from 1 μmol to 1 mmol, preferably from 5 μmol to 800 μmol, and more preferably from 10 μmol to 500 μmol, per 1 μmol of all dihydroxy compounds used for the reaction.

If the amount of the catalyst is too small, the polymerization rate is slowed down and for obtaining a resin having a desired molecular weight, the polymerization temperature must be raised to make up for it. Consequently, the hue of the obtained resin is highly likely to deteriorate, or it is likely that an unreacted raw material volatilizes halfway through the polymerization to change the molar proportion of a dihydroxy compound and a diester compound and a desired molecular weight is not reached. On the other hand, if the amount of the polymerization catalyst used is too large, an undesirable side reaction may occur in combination to deteriorate the hue of the obtained resin or cause coloring of the resin at the time of formation processing.

Of Group 1 metals, sodium, potassium and cesium may adversely affect the hue in the case where they are contained in a large amount in the resin. Such a metal may migrate not only from the catalyst used but also from the raw material or the reaction apparatus. Irrespective of the source, the total amount of compounds of these metals in the resin may be, in terms of the metal amount, 2 μmol or less, preferably 1 μmol or less and more preferably 0.5 μmol or less, per 1 mol of all dihydroxy compounds above.

In the case of producing a polyester carbonate by using the diester compound having an oligofluorene structural unit (the general formula (13)) as the monomer, the diester compound where $A^3$ and $A^4$ are an aromatic hydrocarbon group is preferably used, and it is more preferable to use the diester compound where $A^3$ and $A^4$ are a phenyl group. Using such a diester compound makes it possible to provide good polymerization reactivity, reduce the amount of the catalyst used, enhance the color tone or thermal stability of the obtained resin, and decrease the extraneous matter in the resin.

The resin for use in the present invention can be, after being polymerized as above, usually cooled/solidified and pelletized by a rotary cutter or the like. The method for pelletization is not particularly limited but includes, for example, a method where the resin is withdrawn in the molten state from the polymerization reactor in the final stage, cooled/solidified in the form of a strand and pelletized; a method where the resin is fed in the molten state to a single-screw or twin-screw extruder from the polymerization reactor in the final stage, melt-extruded, then cooled/solidified, and pelletized; and a method where the resin is withdrawn in the molten state from the polymerization reactor in the final stage, cooled/solidified in the form of a strand and once pelletized and thereafter, the resin is again fed to a single-screw or twin-screw extrude, melt-extruded, then cooled/solidified, and pelletized.

The molecular weight of the thus-obtained resin can be expressed by reduced viscosity. If the reduced viscosity of the resin is too low, the mechanical strength of the formed article may be reduced. The reduced viscosity is usually 0.20 dL/g or more and preferably 0.30 dL/g or more. On the other hand, if the reduced viscosity of the resin is too high, flowability at the time of forming tends to be reduced, deteriorating the productivity or formability. For this reason, the reduced viscosity is usually 1.20 dL/g or less, preferably 1.00 dL/g or less and more preferably 0.80 dL/g or less. As for the reduced viscosity, a solution having a polycarbonate concentration precisely adjusted to 0.6 g/dL is prepared by using methylene chloride as a solvent and measured by means of an Ubbelohde viscometer at a temperature of 20.0° C.±0.1° C.

The reduced viscosity is correlated to the melt viscosity of the resin and therefore, usually, a stirring power of a polymerization reactor, a discharge pressure of a gear pump for transferring the molten resin or the like can be used as an indicator for the operation control. More specifically, at the time when the indicated value of equipment for the operation above reaches a target value, the polymerization reaction is stopped by returning the pressure of the reactor to ordinary pressure or withdrawing the resin from the reactor.

In the case of using a diester compound for the polycondensation reaction, a byproduct monohydroxy compound may remain in the resin and volatilize at the time of film production or stretching to cause an odor, deteriorating the working environment or contaminating a transporting roll or the like to impair the appearance of the film. In the case of using diphenyl carbonate (DPC) that is a particularly useful carbonic acid diester, the byproduct phenol has a relatively high boiling point and is likely to remain in the resin without being sufficiently removed even by a reaction under reduced pressure.

Accordingly, the content of a carbonic acid diester-derived monohydroxy compound contained in the resin is preferably 1,500 ppm by mass or less, more preferably 1,000 ppm by mass or less and still more preferably 700 ppm by mass or less. In order to solve the above-described problem, the content of a monohydroxy compound is preferably smaller, but it is difficult in a melt polymerization method to reduce the content of a monohydroxy compound remaining in a polymer to zero, and an enormous effort is required for its removal. Usually, the above-described problem can be sufficiently suppressed by reducing the monohydroxy compound content up to 1 ppm by mass.

In order to reduce the content of low molecular components remaining in the resin, including the carbonic acid diester-derived monohydroxy compound, it is effective to perform degassing of the resin in an extruder as described above or adjust the pressure in the latter stage of polymerization to 3 kPa or less, preferably 2 kPa or less and more preferably 1 kPa or less.

In the case of reducing the pressure in the latter stage of polymerization, if the reaction pressure is excessively reduced, the molecular weight may be rapidly increased, making it difficult to control the reaction. The resin is therefore preferably produced by controlling the terminal group concentration thereof to be terminal hydroxy group-rich or terminal ester group-rich and bias the terminal group balance. Above all, in view of thermal stability, the amount of the terminal hydroxyl group is preferably 50 mol/ton or less and particularly 40 mol/ton or less. The amount of the terminal hydroxyl group can be quantitatively determined by $^1$H-NMR or the like. The amount of the terminal hydroxyl group can be adjusted by the charged molar ratio of all dihydroxy compounds and all diester compounds.

In the resin above, a heat stabilizer may be blended, if desired, so as to prevent reduction in the molecular weight during forming or the like or deterioration of the hue. The heat stabilizer includes a hindered phenol-based heat stabilizer and/or a phosphorus-based heat stabilizer, which are generally known.

As the hindered phenol-based compound, for example, the following compounds may be employed: 2,6-di-tert-butylphenol, 2,4-di-tert-butylphenol, 2-tert-butyl-4-methoxyphenol, 2-tert-butyl-4,6-dimethylphenol, 2,6-ditert-butyl-4-methylphenol, 2,6-di-tert-butyl-4-ethylphenol, 2,5-di-tert-butylhydroquinone, n-octadecyl-3-(3',5'-di-tert-butyl-4'-hydroxyphenyl)propionate, 2-tert-butyl-6-(3'-tert-butyl-5'-methyl-2'-hydroxybenzyl)-4-methylphenyl acrylate, 2,2'-methylene-bis(4-methyl-6-tert-butylphenol), 2,2'-methylene-bis(6-cyclohexyl-4-methylphenol), 2,2'-ethylidene-bis(2,4-di-tert-butylphenol), tetrakis-[methylene-3-(3',5'-di-tert-butyl-4'-hydroxyphenyl)propionate]-methane, and 1,3,5-trimethyl-2,4,6-tris-(3,5-di-tert-butyl-4-hydroxybenzyl)benzene. Among these, tetrakis-[methylene-3-(3',5'-di-tert-butyl-4'-hydroxyphenyl)propionate]-methane, n-octadecyl-3-(3',5'-di-tert-butyl-4'-hydroxyphenyl)propionate, 1,3,5-trimethyl-2,4,6-tris-(3,5-di-tert-butyl-4-hydroxybenzyl)benzene are preferably used.

As the phosphorus-based compound, for example, the following phosphorous acid, phosphoric acid, phosphonous acid, phosphonic acid, and an ester or the like thereof may be employed, but a phosphorus-based compound other than these compounds may also be employed: triphenyl phosphite, tris(nonylphenyl)phosphite, tris(2,4-di-tert-butylphenyl)phosphite, tridecyl phosphite, trioctyl phosphite, trioctadecyl phosphite, didecylmonophenyl phosphite, dioctylmonophenyl phosphite, diisopropylmonophenyl phosphite, monobutyldiphenyl phosphite, monodecyldiphenyl phosphite, monooctyldiphenyl phosphite, bis(2,6-di-tert-butyl-4-methylphenyl)pentaerythritol diphosphite, 2,2'-methylenebis(4,6-di-tert-butylphenyl)octyl phosphite, bis(nonylphenyl)pentaerythritol diphosphite, bis(2,4-di-tert-butylphenyl)pentaerythritol diphosphite, distearylpentaerythritol diphosphite, tributyl phosphate, triethyl phosphate, trimethyl phosphate, triphenyl phosphate, diphenyl-monoorthoxenyl phosphate, dibutyl phosphate, dioctyl phosphate, diisopropyl phosphate, tetrakis(2,4-di-tert-butylphenyl) 4,4'-biphenylenediphosphinate, dimethyl benzenephosphonate, diethyl benzenephosphonate, and dipropyl benzenephosphonate. One of these heat stabilizers may be used alone, or two or more thereof may be used in combination.

The heat stabilizer may be added to the reaction solution at the time of melt polymerization or may be added to the resin by using the extruder and kneaded. In the case of producing a film by a melt extrusion method, it may be produced by adding the heat stabilizer or the like to the extruder, or the heat stabilizer or the like may be previously added to the resin and shaped into pellet or the like by means of an extruder before use.

The amount of the heat stabilizer blended is preferably 0.0001 parts by mass or more, more preferably 0.0005 parts by mass or more and still more preferably 0.001 parts by mass or more, and preferably 1 part by mass or less, more preferably 0.5 parts by mass or less and still more preferably 0.2 parts by mass or less, relative to 100 parts by mass of the resin used in the present invention.

In the resin above, an antioxidant generally known to prevent oxidation may be blended, if desired. As the antioxidant, for example, the following compounds may be employed, but a compound other than these may also be employed: pentaerythritol tetrakis(3-mercaptopropionate), pentaerythritol tetrakis(3-laurylthiopropionate), glycerol-3-stearylthiopropionate, triethylene glycol-bis[3-(3-tert-butyl-5-methyl-4-hydroxyphenyl)propionate], 1,6-hexanediol-bis[3-(3,5-di-tert-butyl-4-hydroxyphenyl)propionate], pentaerythritol tetrakis[3-(3,5-di-tert-butyl-4-hydroxyphenyl)propionate], octadecyl-3-(3,5-di-tert-butyl-4-hydroxyphenyl)propionate, 1,3,5-trimethyl-2,4,6-tris(3,5-di-tert-butyl-4-hydroxybenzyl)benzene, N,N-hexamethylenebis(3,5-di-tert-butyl-4-hydroxy-hydrocinnamide), diethyl 3,5-di-tert-butyl-4-hydroxy-benzylphosphonate, tris(3,5-di-tert-butyl-4-hydroxybenzyl) isocyanurate, tetrakis(2,4-di-tert-butylphenyl) 4,4'-biphenylene-diphosphonate, and 3,9-bis{1,1-di methyl-2-[β-(3-tert-butyl-4-hydroxy-5-methylphenyl)propionyloxy]ethyl}-2,4,8,10-tetraoxaspiro(5,5)undecane. One of these antioxidants may be used alone, or two or more thereof may be used in combination. The amount of the antioxidant blended is preferably 0.0001 parts by mass or more and preferably 0.5 parts by mass or less, relative to 100 parts by mass of the resin of the present invention.

Furthermore, in the resin above, an ultraviolet absorber, a release agent, an antistatic agent, a slip agent, a lubricant, a plasticizer, a compatibilizer, a nucleating agent, a flame retardant, an inorganic filler, an impact improver, a foaming agent, a dye/pigment, or the like, which are usually employed, may be contained, as long as the object of the present invention is not deteriorated.

For the purpose of modifying the properties of the resin, such as mechanical properties and solvent resistance, the resin may be kneaded to provide a polymer alloy with one or two or more members of a synthetic resin such as aromatic polycarbonate, aromatic polyester, aliphatic polyester, polyamide, polystyrene, polyolefin, acryl, amorphous polyolefin, ABS, AS, polylactic acid, and polybutylene succinate, rubber or the like.

The resin for use in the present invention can be produced by mixing the above-described additive and modifier with the components above all at a time or in any desired order by means of a mixing machine such as tumbler, V-shaped blender, Nauter mixer, Banbury mixer, kneading roll, and extruder. Among these, from the standpoint of improving dispersibility, kneading by an extruder, particularly, a twin-screw extruder, is preferred.

The resin obtained as above has a low birefringence, is excellent in the heat resistance and formability, and also has high transparency with little coloring and therefore, can be used for an optical film, an optical disc, an optical prism, a pickup lens, or the like, but, among others, is suitably used as a retardation film.

<Production Method of Unstretched Film>

As the method for producing an unstretched film by using the resin above, a casting method of dissolving the resin in a solvent, casting the solution and removing the solvent, or a melt film production method of melting the resin without use of a solvent and producing a film, may be employed. The melt film production method specifically includes a melt extrusion method using a T-die, a calender forming method, a hot pressing method, a co-extrusion method, a co-melting method, a multilayer extrusion method, an inflation forming method, and the like. The method for producing an unstretched film is not particularly limited, but since a casting method may cause a problem due to remaining solvent, a melt film production method is preferred, and in view of ease of the later-described stretching, a melt extrusion method using a T-die is more preferred.

In the case of forming an unstretched film by the melt film production method, the forming temperature is preferably 270° C. or lower, more preferably 265° C. or lower and still more preferably 260° C. or lower. If the forming temperature is too high, a defect due to an extraneous matter in the obtained film or generation of an air bubble may be increased, or the film may be colored. However, if the forming temperature is too low, the melt viscosity of the resin is excessively increased, making it difficult to shape a raw film, and it may be difficult to produce an unstretched film having a uniform thickness. For this reason, the lower limit of the forming temperature is usually 200° C. or higher, preferably 210° C. or higher and more preferably 220° C. or higher. The forming temperature of an unstretched film as used herein is a temperature at the time of forming in the melt film production method and usually indicates a value obtained by measuring the temperature at the die outlet from which the molten resin is extruded.

An extraneous matter, if present in the film, is recognized as a defect, such as light leakage, in the case where the film is used as a polarizing plate. In order to remove the extraneous material in the resin, preferred is a method of attaching a polymer filter after the extruder above, filtering the resin, and then extruding the resin from a die to form a film. At this time, the molten resin needs to be transferred by connecting an extrude, a polymer filter and a die by a pipe, and in order to suppress thermal deterioration in the pipe as much as possible, it is important to arrange respective facilities to provide a shortest residence time. In addition, it is required to perform the process of transportation or winding of the film after extrusion in a clean room and be careful as best as possible to prevent attachment of an extraneous matter to the film.

The thickness of the unstretched film is determined in accordance with the film thickness design of the retardation film after stretching or the stretching conditions such as stretch ratio, but if the thickness is too large, thickness unevenness is readily produced, whereas if the thickness is too small, breakage may be caused during stretching. For this reason, it is usually 30 μm or more, preferably 40 μm or more and more preferably 50 μm or more, and usually 200 μm or less, preferably 160 μm or less and more preferably 120 μm or less. In the case where the unstretched film has thickness unevenness, this causes retardation unevenness of a retardation film and therefore, the thickness of a portion used as a retardation film is preferably set thickness±3 μm or less, more preferably set thickness±2 μm or less and still more preferably set thickness±1 μm or less.

The length in the longitudinal direction of the unstretched film is preferably 500 m or more, more preferably 1,000 m or more and still more preferably 1,500 m or more. In view of productivity or quality, at the time of production of the retardation film of the present invention, stretching is preferably performed continuously, but usually, the conditions need to be adjusted at the start of stretching so as to provide predetermined retardation. If the length of the film is too short, the amount of the product obtainable after the adjustment of conditions is decreased. In this description, the "long" means that the dimension in the longitudinal direction of the film is sufficiently larger than that in the width direction, and substantially indicates a length to an extent that the film can be wound in the longitudinal direction and formed into a coil. More specifically, this term means that the dimension in the longitudinal direction of the film is 10 times or more larger than the dimension in the width direction.

<Production Method of Retardation Film>

The retardation film can be obtained by orienting the unstretched film above through stretching. As the stretching method, a known method such as longitudinal uniaxial stretching, transverse uniaxial stretching using a tenter or the like, and a combination thereof such as simultaneous biaxial stretching and successive biaxial stretching, may be used. The stretching may be performed by a batch system but in view of productivity, is preferably performed by a continuous system. Furthermore, compared with a batch system, a retardation film with little variation in the retardation in the film plane is obtained in a continuous system.

The stretching temperature is, relative to the glass transition temperature (Tg) of the resin used as the raw material, set to a range of from (Tg−20° C.) to (Tg+30° C.), preferably from (Tg−10° C.) to (Tg+20° C.) and more preferably from (Tg−5° C.) to (Tg+15° C.). The stretch ratio is determined according to the target retardation value but is, in each of longitudinal and transverse directions, preferably from 1.2 times to 4 times, more preferably from 1.5 times to 3.5 times and still more preferably from 2 times to 3 times. If the stretch ratio is too small, an effective range where desired orientation degree and orientation angle are obtained is narrow. On the other hand, if the stretch ratio is too large, the film may be broken during stretching or wrinkling may occur.

The stretching rate is also appropriately selected according to the purposed but may be selected to be, in terms of the strain rate represented by the following mathematical formula, usually from 50% to 2,000%, preferably from 100% to 1,500%, more preferably from 200% to 1,000%, and still more preferably from 250% to 500%. If the stretching rate is excessively large, breakage during stretching may be caused or fluctuation of optical properties due to long-term use under high temperature conditions may become large. If the stretching rate is excessively small, not only the productivity is reduced but also the stretch ratio must be sometimes excessively increased so as to obtain desired retardation.

Strain rate (%/min)={stretching rate(mm/min)/length of raw film (mm)}×100

The film after being stretched may be subjected to a heat setting treatment by a heating furnace, if desired, or may be subjected to a relaxation step of controlling the width of the tenter or adjusting the circumferential speed of the roll. The temperature of the heat setting treatment is, relative to the glass transition temperature (Tg) of the resin used for the unstretched film, from 60° C. to (Tg)° C. and preferably from 70° C. to (Tg−5°) C. If the heat treatment temperature is too high, the molecular orientation obtained by stretching may be disrupted, leading to a significant drop from the desired retardation. In the case of providing a relaxation step, the stress produced in the stretched film can be removed by causing a shrinkage of 95% to 100% relative to the width of the film expanded by stretching. At this time, the treatment temperature applied to the film is the same as the temperature of heat setting treatment. By performing the above-described heat setting treatment or relaxation step, the fluctuation of optical properties due to a long-term use under high-temperature conditions can be suppressed.

The retardation film of the present invention can be manufactured by appropriately selecting and adjusting the treatment conditions in such a stretching step.

<Use of Retardation Film of the Present Invention>

The above-described retardation film is stacked on and laminated with a known polarizing film and cut into a desired dimension to provide a circularly polarizing plate. This circularly polarizing plate can be used, for example, for compensation of viewing angle, prevention of external light reflection, color compensation, conversion of linearly-polarized light to circularly-polarized light, or the like, in various displays (liquid crystal display device, organic EL display device, plasma display device, FED field emission display device, SED surface-conduction electron-emitter display device). In particular, when it is used in a circularly polarizing plate for prevention of external light reflection of an organic EL display, clear black display can be achieved, and the reliability of quality is also excellent. Furthermore, it has a performance capable of coping with thinning of a device in the future.

<Manufacture of Polarizing Plate>

As the polarizing film above, a polarizing film having an absorption axis in either the width direction or the longitudinal direction can be employed. Specifically, examples thereof include a film obtained by adsorbing a dichroic substance such as iodine or dichroic dye, to a hydrophilic polymer film such as polyvinyl alcohol-based film, partially-formalized polyvinyl alcohol-based film or partially-saponified ethylene/vinyl acetate copolymer film, and then uniaxially stretching the film; and a polyene-based oriented film such as dehydration product of polyvinyl alcohol or dehydrochlorination product of polyvinyl chloride. Among these, a long polarizing film obtained by adsorbing a dichroic substance such as iodine, to a polyvinyl alcohol-based film and uniaxially stretching the film is particularly preferred, because the polarization dichroic ratio is high. The thickness of this long polarizing film is not particularly limited but is generally on the order of from 1 to 80 µm.

The polarizing film obtained by adsorbing iodine to a polyvinyl alcohol-based film and uniaxially stretching the film can be manufactured, for example, by dipping polyvinyl alcohol in an aqueous solution of iodide to dye the film, and stretching it to from 3 to 7 times the original length. The aqueous solution may contain boric acid, zinc sulfate, zinc chloride or the like, if desired. In addition, polyvinyl alcohol may also be dipped in an aqueous solution of potassium iodide or the like.

If desired, the polyvinyl alcohol-based film before dyeing may be washed with water by dipping it in water. By washing the polyvinyl alcohol-based film with water, a contaminant and an anti-blocking agent on the surface of the polyvinyl alcohol-based film can be washed out. Furthermore, since the polyvinyl alcohol-based film swells, there is also an effect of preventing unevenness such as uneven dyeing. The film may be died with iodine and then stretched, may be stretched while dyeing the film, or may be stretched and then died with iodine. The stretching may also be performed in an aqueous solution of boric acid, potassium iodide or the like, or in a water bath.

In the circularly polarizing plate above, the angle between a slow axis of the retardation film and a width direction of the polarizing film is preferably 38° or larger and 52° or smaller, more preferably 40° or larger and 50° or smaller and still more preferably 42° or larger and 48° or smaller. If it is out of the range above, the later-described external light reflectance may be increased or the reflected light is tinted, leading to deterioration of the image display quality.

The retardation film and the polarizing film may be stacked via an adhesive. As the adhesive, a known adhesive can be used so long as it does not impair the optical properties of the lamination film.

The circularly polarizing plate has, as described above, sufficient optical characteristics and is configured to be suitably usable for a device requiring precision, thinness and homogeneousness. Consequently, the circularly polarizing plate can be suitably used, for example, in a liquid crystal panel used for a liquid-crystal display, and in an organic EL panel used for an organic EL display. In particular, an organic EL panel has a metal layer susceptible to reflection of external light and therefore, readily faces a problem of external light reflection and disturbing reflection of background scene. For preventing such external light reflection or the like, it is effective to provide the circularly polarizing plate on a light-emitting surface.

As the indicator for the properties of preventing external light reflection or the like in the organic EL panel, for example, a reflectance and a reflected hue may be employed. The reflectance affects the luminance of display color when displaying black color, that is, in the light-off state of an organic EL device, and as the reflectance is lower, sharper black color is obtained, improving the display visibility. If the reflectance is excessively high, despite an attempt to display black color, the luminance of display color may become large owing to external light reflection, resulting in a low bright room contrast and deteriorated visibility.

The reflected hue affects the color tone of display color at the time of displaying black color, and as the color tone is closer to an achromatic color, sharper black color is obtained. In case where the reflected color tone is tinged, it may be impossible to display black color. For the evaluation of reflected hue, for example, the color coordinate value in a u'-v' chromaticity diagram, an x-y chromaticity diagram or the like can be employed. In other words, the color coordinate of achromatic color in a u'-v' chromaticity diagram and an x-y chromaticity diagram is (u',v')=(0.210, 0.471) and (x,y)=(0.33, 0.33), respectively, and as the reflected hue is closer to the value above, sharper black color can be obtained.

EXAMPLES

The present invention is hereunder described in more detail with reference to the following Examples and Comparative Examples, but the present invention is not limited to these Examples as long as it does not go beyond the gist thereof. The quality evaluation of a fluorene ring-containing monomer (hereinafter referred to as "fluorene-based monomer"), and the characteristics evaluations of the resin and transparent film were performed by the following methods. The method for characteristic evaluation is not limited to the following methods and can be appropriately selected by one skilled in the art.

<Evaluation of Monomer and Resin>

(1) Thermal Decomposition Temperature of Fluorene-Based Monomer

The glass transition temperature of the fluorene-based monomer was measured by using thermogravimetry-differential thermal analyzers, TG-DTA6300, manufactured by SII NanoTechnology, Inc. About 4 mg of the fluorene-based monomer was put in an aluminum pan manufactured by the same company and sealed up, and the temperature was raised from room temperature (from 20 to 30° C.) up to 600° C. at a temperature rise rate of 10° C./min in a nitrogen stream of 200 mL/min. From the obtained TG data (thermogravimetric data), the temperature at which the sample weight is decreased by 5 wt % was designated as a 5 wt % weight loss temperature. With respect to a solvent-containing monomer, the weight at the time where the solvent weight estimated from $^1$H-NMR is decreased from the weight at the start of measurement and the weight becomes not changed was designated as an initial weight, and the temperature at which the initial weight is decreased by 5 wt % was designated as the 5 wt % weight loss temperature. In addition, a peak top when from the obtained TG data (thermogravimetric data), no weight loss is recognized and a steep endothermic peak is observed was taken as the melting point of the sample.

(2) Absorption Maximum Wavelength in Ultraviolet-Visible Region (UV-Vis) of Fluorene-Based Monomer The absorption maximum wavelength in the ultraviolet-visible region (UV-Vis: from 280 to 800 nm) of the fluorene-based monomer was measured by using an ultraviolet-visible light absorption spectrophotometer, UV-1650PC, manufactured by Shimadzu Corporation. The measurement solution was accurately prepared by using tetrahydrofuran as a solvent so that the concentration as the fluorene ring could be 10 µM. By using a 1 cm-square quartz cell for the measurement cell, the measurement was performed in an environment at a temperature of 23±5° C. The absorption spectrum of the measurement solution was measured in the range of from 280 to 800 nm, and the maximum value of absorption was taken as the absorption maximum wavelength ($\lambda_{max}$).

(3) Reduced Viscosity of Resin

A resin solution having a concentration of 0.6 g/dL was prepared by dissolving the resin in methylene chloride. By using an Ubbelohde-type viscosity tube manufactured by Moritomo Rika Kogyo, the measurement was performed at a temperature of 20.0° C.±0.1° C., and the solvent transit time $t_0$ and the solution transit time t were measured. A relative viscosity $\eta_{rel}$ was determined by using the obtained values of $t_0$ and t according to the following formula (i), and a specific viscosity $\eta_{sp}$ was determined by using the obtained relative viscosity $\eta_{rel}$ according to the following formula (ii).

$$\eta_{rel}=t/t_0 \quad \text{(i)}$$

$$\eta_{sp}=(\eta-\eta_0)/\eta_0=\eta_{rel}-1 \quad \text{(ii)}$$

The obtained specific viscosity $\eta_{sp}$ was divided by the concentration c (g/dL) to determine the reduced viscosity $\eta_{sp}/c$. A higher value indicates a larger molecular weight.

(4) Melt Viscosity of Resin

A pellet-like resin was vacuum-dried at 90° C. for 5 hours or more. By using the dried pellet, the measurement was performed by a capillary-ter manufactured by Toyo Seiki Seisaku-sho, Ltd. The measurement temperature was set to 240° C. and the melt viscosity was measured at a shear rate of from 9.12 to 1.824 $\sec^{-1}$, and the value of melt viscosity at 91.2 $\sec^{-1}$ was used. An orifice having a die diameter of 1 mmϕ and a die length of 10 mm was used.

(5) Glass Transition Temperature (Tg) of Resin

The glass transition temperature of the resin was measured by using a differential scanning calorimeter, DSC6220, manufactured by SII NanoTechnology Inc. About 10 mg of the resin was put in an aluminum pan manufactured by the same company and sealed up, and the temperature was raised from 30° C. up to 250° C. at a temperature rise rate of 20° C./min in a nitrogen stream of 50 mL/min. The temperature was kept for 3 minutes, then lowered to 30° C. at a rate of 20° C./min, kept at 30° C. for 3 minutes, and again raised to 200° C. at a rate of 20° C./min. From the DSC data obtained in the second temperature rise, an extrapolated glass transition starting temperature, which is a temperature at the intersection between a straight line created by extending the base line on the low temperature side to the high temperature side, and a tangent line drawn at a point where a curve gradient in a portion showing a stepwise change of glass transition becomes maximum, was determined and taken as the glass transition temperature.

<Evaluation of Unstretched Film>

(6) Formation of Film

A long unstretched film was manufactured by a melt extrusion method as follows. Pellets of the resin that had been vacuum-dried at 90° C. for 5 hours or more were extruded from a T-die (width 200 mm, preset temperature: from 200 to 240° C.) by using a single-screw extruder (screw diameter: 25 mm, cylinder preset temperature: from 220° C. to 250° C.) manufactured by Isuzu Machinery. The extruded film was formed into a roll by a winder while cooling it with a chill roll (preset temperature: from 120 to 150° C.) to manufacture a long unstretched film. A film thickness accuracy of 5% or less could be realized by adjusting the lip width of T-die, the temperature of chill roll, the distance between T-die and chill roll, or the like. In the description of the present invention, the thickness accuracy was calculated according to the following formula. More specifically, the thickness in each position of the film is measured, and a ratio of the difference between the average value and the maximum value or minimum value in the fluctuation range, to the average value indicates the thickness accuracy.

Thickness accuracy[%]=|maximum or minimum value of thickness−average value|/average value×100

(7) Measurements of Refractive Index and Abbe Number

A rectangular specimen having a length of 40 mm and a width of 8 mm was cut out from the unstretched film and used as the measurement sample. By using an interference filter for wavelengths of 656 nm (C line), 589 nm (D line) and 486 nm (F line), the refractive indices $n_C$, $n_D$ and $n_F$ at each wavelength were measured by a multi-wavelength Abbe refractometer, DR-M4/1550, manufactured by ATAGO Co., Ltd. The measurement was performed at 20° C. by using monobromonaphthalene as an interfacial liquid. The Abbe number $v_d$ was calculated according to the following formula.

$$v_d=(1-n_D)/(n_C-n_F)$$

A larger Abbe number indicates smaller wavelength dependency of the refractive index.

(8) Measurement of Total Light Transmittance

An unstretched film having a thickness of about 100 µm was manufactured by the above-described melt extrusion method and measured for the total light transmittance by using a turbidimeter, COH400, manufactured by Nippon Denshoku Industries Co., Ltd.

(9) Photoelastic Coefficient

The unstretched film was cut into a rectangular shape having a width of 20 mm and a length of 100 mm to manufacture a sample. This sample was measured with light having a wavelength of 550 nm by an ellipsometer, M-150, manufactured by JASCO Corporation to obtain a photoelastic coefficient.

(10) Water Absorption Percentage

An unstretched film having a thickness of from 100 to 300 µm was manufactured by the above-described method and cut out into a square having a width of 100 mm and a length of 100 mm to manufacture a sample. By using this sample, the water absorption percentage was measured in conformity with "Test Methods for Water Absorption and Boiling Water Absorption of Plastics" described in JIS K 7209 (1984).

(11) Elastic Modulus

A rectangular test piece having a width of 5 mm and a length of 50 mm was cut out from the film obtained by the above-described method and measured for a storage elastic modulus (E') and a loss elastic modulus (E"). For the measurement, a rheometer, RSA-III, manufactured by TA Instruments was used, the temperature was increased from 0° C. up to a glass transition temperature of each sample or higher in a tensile mode under conditions at a chuck-to-chuck distance of 20 mm, at a temperature rise rate of 3° C./min, at a frequency of 1 Hz, and at a strain of 0.1%, and the measurement was continued until the sample was broken, resulting in stopping. For the elastic modulus in the present invention, a storage elastic modulus at 30° C. was adopted.

(12) Toughness of Film (Bending Test)

An unstretched film having a thickness of from 100 to 200 µm was manufactured by the above-described method, and a rectangular specimen having a length of 40 mm and a width of 10 mm was prepared from the film. Right and left joint surfaces of a vise were spaced apart by a distance of 40 mm, and both ends of the specimen were fixed in the joint surfaces. The distance between right and left joint surfaces was then narrowed at a rate of 2 mm/sec or lower, and while keeping the film not to protrude from the joint surface, the entire film bent substantially in a U shape was compressed within the joint surfaces. A specimen that is broken into two pieces (or three or more pieces) at the bent part before the joint surfaces were in close contact with each other was judged as "broken", and a specimen that can be bent without breaking even when the joint surfaces were completely close contact with each other was judged as "not broken". The test was repeated five times for the same kind of film, and the film was rated "C: The film undergoes brittle fracture" when judged as "broken" four or more times, and rated "A: The film does not undergo brittle facture" when judged as "broken" three or less times.

<Evaluation of Retardation Film>

(13) Stretching of Film

A rectangular film piece having a width of 120 mm and a length of 150 mm was cut out from the long unstretched film prepared by the melt extrusion method, and uniaxial stretching of the film piece above was performed at a stretching rate of 300%/min by using a tenter stretching apparatus, KARO IV, manufactured by Bruckner without holding the film piece in a direction orthogonal to the stretching direction, to thereby obtain a retardation film. The conditions such as stretching temperature and ratio are described in each of Examples and Comparative Examples later.

(14) Retardation and Wavelength Dispersion of Retardation Film

A sample having a width of 4 cm and a length of 4 cm was cut out from the retardation film. The sample was measured for retardation R450 at a wavelength of 450 nm, retardation R550 at a wavelength of 550 nm, and retardation R650 at a wavelength of 650 m in a room at 23° C. by using AxoScan manufactured by Axometrics Inc. By using the obtained retardation values, the value of wavelength dispersion (R450/R550) as a ratio of retardation R450 to retardation R550 and the ratio (R650/R550) of retardation R650 and retardation R550 were calculated. The positive or negative of refractive index anisotropy can be decided from the relationship between the orientation angle (slow axis) and the stretching direction. In the measurement of retardation, in the case where the slow axis is coincident with the stretching direction, the refractive index anisotropy of this resin is positive.

(15) Thickness and Birefringence (Orientation Degree) of Retardation Film

The thickness of the retardation film was measured by using a contact-type thickness gauge, PEACOCK, manufactured by OZAKI MFG Co., Ltd. By using retardation R550 at 550 nm obtained in the measurement of retardation above and the thickness of retardation film, the birefringence (Δn) was determined according to the following formula.

Birefringence=$R550$[nm]/(film thickness[mm]×$10^6$)

A larger value of birefringence indicates a higher orientation degree of the polymer. In addition, as the value of birefringence is larger, the thickness of the film for obtaining a desired retardation value can be reduced.

(16) Change Rate of Retardation

A sample in which an adhesive-applied retardation film is laminated to glass was prepared and measured for the retardation by the same method as in the measurement of retardation above. The sample after measurement was charged into a heated oven at 85° C. for 180 hours. After that, the sample was taken out and again measured for the retardation to determine the change rate of R550.

<Evaluation of Characteristics of Circularly Polarizing Plate Using Retardation Film>

(17) Manufacture of Circularly Polarizing Plate

The retardation film above was coated with an acrylic adhesive film to prepare an adhesive-applied retardation film. The adhesive applied retardation film was laminated together with an adhesive-applied polarizing plate, MCIG1481DUARC9, manufactured by Nitto Denko Corp., such that the absorption axis thereof makes an angle of 45° with the stretching axis of the retardation film, to thereby manufacture a circularly polarizing film.

(18) Manufacture of Organic EL Panel

The organic EL panel was removed from an organic EL display, 15EL9500, manufactured by LG The polarizing plate laminated to the organic EL panel was peeled off, and the circularly polarizing plate above was instead laminated to manufacture an organic EL panel to be tested.

(19) Reflectance and Reflected Hue of Organic EL Panel

The organic EL panel manufactured above was used as the specimen and measured for the reflectance and reflected hue by using a spectrocolorimeter, CM-2600d, manufactured by Konica Minolta, Inc. The reflected hue was indicated by distance Δu'v' from achromatic color on a u'-v' chromaticity diagram, represented by the following formula. In the following formula, each of u' and v' is the value of the color coordinate on the u'-v' chromaticity diagram obtained by the measurement above.

$$\Delta u'v' = \sqrt{(u' \text{ of circularly polarizing plate } - 0.210)^2 + (v' \text{ of circularly polarizing plate } - 0.471)^2} \quad [\text{Math. 1}]$$

Synthesis Examples of Monomers

The synthesis method of monomers used for the production of a resin is described below.

Synthesis Example 1

Synthesis of bis(fluoren-9-yl)methane (Compound 1)

[Chem. 22]

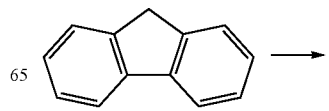

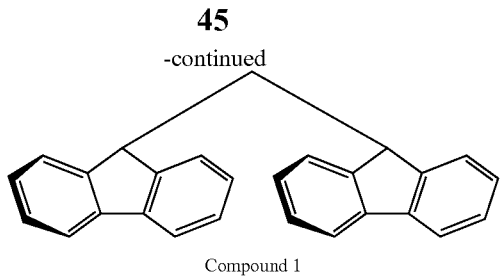

Compound 1

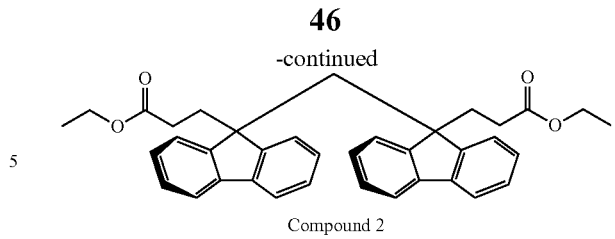

Compound 2

Fluorene (120 g, 722 mmol) and N,N-dimethylformamide (480 ml) were put into a 1 L four-neck flask and after nitrogen purging, cooled to 5° C. or lower. Sodium ethoxide (24.6 g, 361 mmol) was added thereto, and paraformaldehyde (8.7 g, 289 mmol) was added little by little so as not to exceed 10° C., followed by stirring. After 2 hours, 1 N hydrochloric acid (440 ml) was added dropwise to terminate the reaction. The resulting suspended solution was suction-filtered and spray-washed with desalted water (240 ml). Thereafter, the obtained crude product was dispersed in desalted water (240 ml), followed by stirring for one hour, and the resulting suspension was suction-filtered and spray-washed with desalted water (120 ml). The obtained crude product was dispersed in toluene (480 ml) and then dehydrated under heating and refluxing conditions by using a Dean-Stark apparatus. The resulting solution was returned to room temperature (20° C.), then suction-filtered and dried under reduced pressure until reaching constant weight at 80° C. to obtain 80.4 g (yield: 84.5%, HPLC purity: 94.0%) of bis(fluoren-9-yl)methane (Compound 1) as a white solid. The chemical shifts in the $^1$H-NMR spectrum of Compound 1 were as follows.

$^1$H-NMR (400 MHz, CDCl$_3$) δ 7.83 (d, J=7.6 Hz, 4H), 7.56 (dd, J1=7.6 Hz, J2=0.8 Hz, 4H), 7.41 (t, J=7.3 Hz, 4H), 7.29 (dt, J1=7.3 Hz, J2=1.3 Hz, 4H), 4.42 (t, J=7.6 Hz, 2H), 2.24 (d, J=7.6 Hz, 2H).

Synthesis Example 2

Synthesis of bis[9-(2-ethoxycarbonylethyl)fluoren-9-yl]methane (Compound 2)

[Chem. 23]

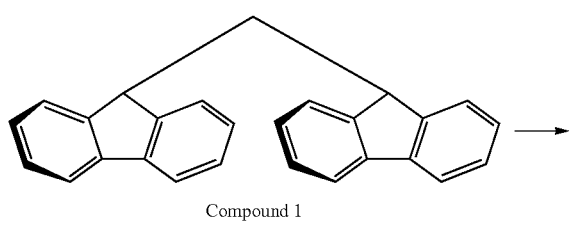

Compound 1

Bis(fluoren-9-yl)methane (Compound 1, 80 g, 232.3 mmol) obtained above, N-benzyl-N,N,N-triethylammonium chloride (10.6 g, 46.5 mmol), and methylene chloride (400 ml) were put in a 1 L three-neck flask and after nitrogen purging, an aqueous 50% sodium hydroxide solution (64 ml) was added while controlling the temperature to from 15° C. to 20° C. on a water bath, as a result, the color of the solution was changed to pale red. Thereafter, ethyl acrylate (50.5 ml, 465 mmol) was added dropwise thereto over 5 minutes. After one hour, ethyl acrylate (25.3 ml, 232 mmol) was further added thereto and while tracking the progress of reaction by HPLC, the solution was stirred for 9 hours. After confirming by HPLC that the proportion of mono-adduct was reduced to 5% or less, the resulting solution was cooled on an ice bath and quenched by adding dropwise 3 N hydrochloric acid (293 ml) correspondingly to the temperature. The organic layer was washed with water until the liquid became neutral, then dried over anhydrous magnesium sulfate and filtered, and the solvent was removed by distillation under reduced pressure. The obtained crude product was dispersed in methanol (400 ml), and the dispersion was heated under reflux for 30 minutes thereby being washed in thermal suspension. Subsequently, the solution was returned to room temperature (20° C.), suction-filtered and dried under reduced pressure until reaching constant weight at 80° C., to thereby obtain 96.1 g (yield: 75.9%, HPLC purity: 96.0%) of bis[9-(2-ethoxycarbonylethyl)fluoren-9-yl]methane (Compound 2) as a white solid. The chemical shifts in the $^1$H-NMR spectrum of Compound 2 were as follows.

$^1$H-NMR (400 MHz, CDCl$_3$) δ 7.03 (d, J=7.6 Hz, 4H), 6.97 (dt, J1=7.6 Hz, J2=1.5 Hz, 4H), 6.82 (dt, J1=7.6 Hz, J2=1.3 Hz, 4H), 6.77 (d, J=7.6 Hz, 4H), 3.88 (q, J=7.1 Hz, 4H), 3.12 (s, 2H), 2.23 (m, 4H), 1.13 (m, 4H), 1.02 (t, J=7.1 Hz, 6H).

The 5 wt % weight loss temperature (in a nitrogen atmosphere) of Compound 2 was 295° C., and the melting point was 141° C.

Synthesis Example 3

Synthesis of bis[9-(2-phenoxycarbonylethyl)fluoren-9-yl]methane (Compound 3)

[Chem. 24]

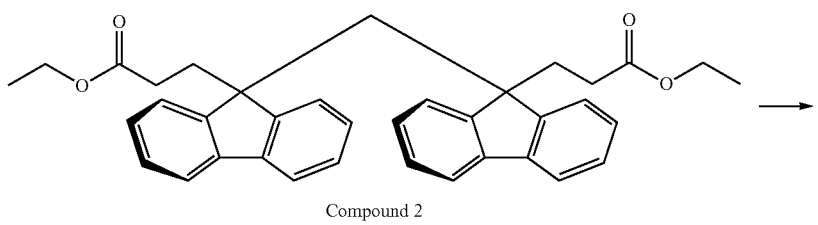

Compound 2

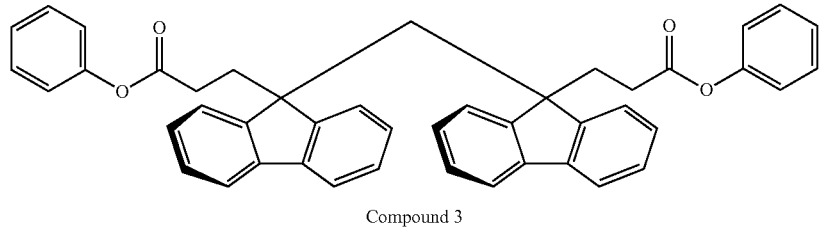

Compound 3

Bis[9-(2-ethoxycarbonylethyl)fluoren-9-yl]methane (Compound 2, 50.0 g, 91.80 mmol) obtained above, diphenyl carbonate (98.3 g, 459 mmol), and tetraisopropyl orthotitanate (1.3 mL, 4.59 mmol) were put in a 1 L four-neck flask, and the degree of reduced pressure was adjusted to 3 kPa, followed by stirring for 6 hours while removing byproducts by distillation at a temperature of from 145° C. to 150° C., and then, cooled to 90° C. After confirming the completion of reaction by HPLC, toluene (100 ml) was added thereto. The resulting solution was cooled to 50° C., and methanol (250 ml) was added thereto. After cooling to 5° C., the solution was suction-filtered. The obtained white solid was dispersed in toluene (100 ml), and the dispersion was heated under reflux for 30 minutes. After cooling to 50° C., methanol (200 ml) was added thereto. The resulting solution was cooled to room temperature (20° C.), suction-filtered and dried under reduced pressure until reaching constant weight at 100° C., to thereby obtain 50 g (yield: 85%, HPLC purity: 98.1%) of bis[9-(2-phenoxycarbonylethyl)fluoren-9-yl]methane (Compound 3) as a white solid. The chemical shifts in the $^1$H-NMR spectrum of Compound 3 were as follows.

$^1$H-NMR (400 MHz, CDCl$_3$) δ 7.23-7.28 (m, 4H), 7.07-7.16 (m, 6H), 7.03 (dt, J1=6.9 Hz, J2-2.0, 4H), 6.78-6.90 (m, 12H), 3.20 (s, 2H), 2.37 (t, J=8.3 Hz, 4H), 1.40 (t, J=8.3 Hz, 4H).

The 5 wt % weight loss temperature (in a nitrogen atmosphere) of Compound 3 was 336° C., and the melting point was 176° C.

Synthesis Example and Characteristic Evaluation of Resin

Abbreviations or the like of the compounds used in Examples and Comparative Examples below are as follows.
BHEPF: 9,9-bis[4-(2-hydroxyethoxy)phenyl]-fluorene (produced by Osaka Gas Chemicals Co., Ltd.)
BCF: 9,9-bis[4-hydroxy-3-methylphenyl]-fluorene (produced by Osaka Gas Chemicals Co., Ltd.)
DPC: diphenyl carbonate (produced by Mitsubishi Chemical Corporation)
ISB: isosorbide (produced by Roquette Freres, trade name: POLYSORB)
CHDM: 1,4-cyclohexanedimethanol (a mixture of cis and trans, produced by SK Chemicals Ltd.)
SPG: spiroglycol (produced by Mitsubishi Gas Chemical Industries Ltd.)
BPA: 2,2-bis[4-hydroxyphenyl]propane (produced by Mitsubishi Chemical Corporation)
PEG: polyethylene glycol, number-average molecular weight: 1,000 (produced by Sanyo Chemical Industries, Ltd.)

Example 1

Polymerization was performed by using a batch polymerization apparatus composed of two vertical reactors and equipped with a stirring blade and a reflux condenser controlled to 100° C. Thereinto were charged 36.94 parts by mass (0.058 mol) of bis[9-(2-phenoxycarbonylethyl)fluoren-9-yl]methane (Compound 3), 64.02 parts by mass (0.438 mol) of ISB, 82.43 parts by mass (0.385 mol) of DPC, and as a catalyst, 3.86×10$^{-4}$ parts by mass (2.19×10$^{-6}$ mol) of calcium acetate monohydrate, and the inside of the reactor was purged with nitrogen under reduced pressure. Heating was performed with a heating medium, and at the point when the inner temperature reached 100° C., stirring was started. The inner temperature was allowed to reach 220° C. after 40 minutes from the start of temperature rise and while controlling the system to keep this temperature, pressure reduction was started to reach 13.3 kPa in 90 minutes after reaching 220° C. A phenol vapor by-produced along with the polymerization reaction was introduced into the reflux condenser at 100° C., and a slight amount of monomer component contained in the phenol vapor was returned to the reactor. The uncondensed phenol vapor was introduced into a condenser at 45° C. and recovered. After introducing nitrogen into the first reactor to once return the pressure to atmospheric pressure, the oligomerized reaction solution in the first reactor was transferred to the second reactor. Subsequently, temperature rise and pressure reduction in the second reactor were started, as a result, the inner temperature and the pressure respectively reached 240° C. and 0.2 kPa in 50 minutes, respectively. Thereafter, polymerization was allowed to proceed until a predetermined stirring power occurred. At the point when a predetermined power was achieved, the pressure was recovered by introducing nitrogen into the reactor, and the produced polyester carbonate was extruded into water to form a strand and cut to obtain a pellet.

From the obtained polyester carbonate, a long unstretched film having a length of 3 m, a width of 200 mm and a thickness of 77 μm was manufactured by using the above-described melt extrusion method. Subsequently, the long unstretched film was subjected to longitudinal uniaxial stretching at a stretching temperature of 161° C. and a stretch ratio of 2.52 times to manufacture a retardation film, and by using the obtained retardation film, a circularly polarizing plate was manufactured and mounted on an organic EL panel. The results of various evaluations are shown in Table 1.

The retardation film of this Example exhibits reverse wavelength dispersion property and is excellent in all properties such as orientation degree, photoelastic coefficient, reliability, heat resistance, and toughness. In the evaluation of mounting on an organic EL panel, the external light reflectance was kept low, and the hue presented clear black color.

Example 2

A retardation film was manufactured in the same manner as in Example 1 except that 38.06 parts by mass (0.059 mol)

of bis[9-(2-phenoxycarbonylethyl)fluoren-9-yl]methane (Compound 3), 43.06 parts by mass (0.295 mol) of ISB, 20.28 parts by mass (0.141 mol) of CHDM, 81.46 parts by mass (0.380 mol) of DPC, and $3.83 \times 10^{-4}$ parts by mass ($2.18 \times 10^{-6}$ mol) of calcium acetate monohydrate were used, the thickness of the unstretched film was changed to 68 µm, and the stretching temperature and the stretch ratio were changed to 129° C. and 2.4 times, respectively. The results of various evaluations are shown in Table 1.

It can be understood that in the retardation film of this Example, the value of birefringence is larger than in Example 1 and therefore, the orientation degree of the polymer is high. It also exhibited excellent properties in the evaluation of mounting on an organic EL panel.

Example 3

A retardation film was manufactured in the same manner as in Example 1 except that 29.60 parts by mass (0.046 mol) of bis[9-(2-phenoxycarbonylethyl)fluoren-9-yl]methane (Compound 3), 29.21 parts by mass (0.200 mol) of ISB, 42.28 parts by mass (0.139 mol) of SPG, 63.77 parts by mass (0.298 mol) of DPC, and $1.19 \times 10^{-2}$ parts by mass ($6.78 \times 10^{-5}$ mol) of calcium acetate monohydrate were used, the thickness of the unstretched film was changed to 61 µm, and the stretching temperature and the stretch ratio were changed to 134° C. and 3.15 times, respectively. The results of various evaluations are shown in Table 1.

The retardation film of this Example expressed a lower photoelastic coefficient than that in Example 1. It also exhibited excellent properties in the evaluation of mounting on an organic EL panel.

Example 4

A retardation film was manufactured in the same manner as in Example 1, except that 37.43 parts by mass (0.058 mol) of bis[9-(2-phenoxycarbonylethyl)fluoren-9-yl]methane (Compound 3), 43.31 parts by mass (0.296 mol) of ISB, 20.40 parts by mass (0.141 mol) of CHDM, 82.20 parts by mass (0.380 mol) of DPC, and $3.86 \times 10^{-4}$ parts by mass ($2.19 \times 10^{-6}$ mol) of calcium acetate monohydrate were used, the thickness of the unstretched film was changed to 38 µm, and the stretching temperature and the stretch ratio were changed to 130° C. and 2.4 times, respectively. The results of various evaluations are shown in Table 1.

In the retardation film of this Example, since the reverse wavelength dispersion properties were weakened as compared with Example 2, the value of refractive index could be made larger than that in Example 1, and the orientation degree of the polymer could be improved. The retardation film of this Example provides a panel having a hue of far from the neutral point as compared with Example 2; however, depending upon the use, in the case that thinning of the film is regarded as important, the retardation film of Example 4 can be suitably used.

Comparative Example 1

A long retardation film was manufactured in the same manner as in Example 1, except that 68.07 parts by mass (0.155 mol) of BHEPF, 22.84 parts by mass (0.156 mol) of ISB, 0.97 parts by mass ($9.75 \times 10^{-4}$ mol) of PEG, 67.60 parts by mass (0.316 mol) of DPC, and $5.36 \times 10^{-4}$ parts by mass ($2.50 \times 10^{-6}$ mol) of magnesium acetate tetrahydrate were used, the thickness of the unstretched film was changed to 101 µm, and the stretching temperature and the stretch ratio were changed to 149° C. and 2.4 times, respectively. The results of various evaluations are shown in Table 1.

In the retardation film of this Example, the orientation properties were low as compared with the Examples, and in order to obtain a predetermined retardation, it was needed to make the film thick. In addition, the retardation film of this example has a large change rate of retardation, so that it can be understood that it has low reliability. In addition, in the evaluation of mounting on an organic EL panel, the results were poor as compared with the Examples.

Comparative Example 2

A retardation film was manufactured in the same manner as in Example 1 except that 63.72 parts by mass (0.145 mol) of BHEPF, 26.74 parts by mass (0.183 mol) of ISB, 0.97 parts by mass ($9.75 \times 10^{-4}$ mol) of PEG, 71.24 parts by mass (0.333 mol) of DPC, and $7.06 \times 10^{-4}$ parts by mass ($3.29 \times 10^{-6}$ mol) of magnesium acetate tetrahydrate were used, the thickness of the unstretched film was changed to 80 µm, and the stretching temperature and the stretch ratio were changed to 149° C. and 2.2 times, respectively. The results of various evaluations are shown in Table 1.

In the retardation of this Example, it was attempted to increase the birefringence by weakening the reverse wavelength dispersion properties as compared with Comparative Example 1. However, the film could not be made thin to a level in the Examples. In addition, in the evaluation of mounting on an organic EL panel, the results were poor as compared with the Examples.

Comparative Example 3

A retardation film was manufactured in the same manner as in Example 1 except that 32.20 parts by mass (0.085 mol) of BCF, 60.43 parts by mass (0.199 mol) of SPG, 64.40 parts by mass (0.301 mol) of DPC, and $5.00 \times 10^{-3}$ parts by mass ($2.84 \times 10^{-5}$ mol) of calcium acetate monohydrate were used, the final polymerization temperature was changed to 260° C., the thickness of the unstretched film was changed to 100 µm, and the stretching temperature and the stretch ratio were changed to 145° C. and 2 times, respectively. The results of various evaluations are shown in Table 1.

In the retardation film of this Example, the birefringence is small as compared with Examples, and the orientation degree of the polymer is low. Therefore, the thickness of the film could not be made thin to a level in the Examples. In addition, it can be understood that the toughness is poor as compared with Examples. Furthermore, in the evaluation of mounting on an organic EL panel, the results were poor as compared with the Examples.

Comparative Example 4

A retardation film was manufactured in the same manner as in Example 1, except that 80.49 parts by mass (0.184 mol) of BHEPF, 13.23 parts by mass (0.058 mol) of BPA, 53.29 parts by mass (0.249 mol) of DPC, and $2.13 \times 10^{-3}$ parts by mass ($1.21 \times 10^{-5}$ mol) of calcium acetate monohydrate were used, the final polymerization temperature was changed to 260° C., the thickness of the unstretched film was changed to 102 µm, and the stretching temperature and the stretch ratio were changed to 153° C. and 2 times, respectively. The results of various evaluations are shown in Table 1.

The retardation film of this Example was inferior in orientation properties and reliability as compared with the Examples. In addition, it can be understood that the toughness is inferior as compared with the Examples.

Comparative Example 5

ZF14-040, manufactured by Zeon Corporation (unstretched film thickness: 40 μm, Tg: 134° C.) was stretched under a condition at a stretching temperature of 141.5° C. and at a stretch ratio of 1.5 times, thereby obtaining a retardation film having a retardation of 140 nm.

In addition, ZF14-050, manufactured by Zeon Corporation (unstretched film thickness: 50 μm, Tg: 134° C.) was stretched under a condition at a stretching temperature of 140.5° C. and at a stretch ratio of 2.2 times, thereby obtaining a retardation film having a retardation of 270 nm.

An acrylic adhesive was applied to these two retardation films to obtain adhesive-applied retardation films. Subsequently, in manufacturing a circularly polarizing plate, an oval polarizing plate was prepared by sticking in such a manner that an angle formed by the absorption axis of a polarizing plate and the stretching direction of the retardation film of 270 nm was 15°, and subsequently, on the retardation film side of the oval polarizing plate, the retardation film of 140 nm was further stuck in such a manner that an angle formed by the absorption axis of the polarizing plate and the stretching direction of the retardation film of 140 nm was 75°, thereby manufacturing a circularly polarizing plate. The fabrication of an organic EL panel and the measurements of reflectance and reflective hue were performed in the same manners as in Example 1.

In the retardation film of this Example, since the two retardation plates were laminated, the thickness of the film could not be made thin to a level in the Examples. In addition, in the evaluation of mounting on a panel, the results were poor as compared with the Examples.

Comparative Example 6

A retardation film was manufactured in the same manner as in Example 1, except that 84.90 parts by mass (0.581 mol) of ISB, 125.69 parts by mass (0.587 mol) of DPC and $8.19 \times 10^{-5}$ parts by mass ($4.65 \times 10^{-7}$ mol) of calcium acetate monohydrate were used, the thickness of the unstretched film was changed to 17 μm, and the stretching temperature and the stretch ratio were changed to 166° C. and 2 times, respectively. The results of the various evaluations are shown in Table 1.

The retardation film of this Example did not exhibit reverse wavelength dispersion property. In addition, in the evaluation of mounting on an organic EL panel, the results were poor as compared with the Examples.

In addition, a graph plotting a birefringence (Δn) and wavelength dispersion (R450/R550) obtained in the Examples and Comparative Examples is shown in FIG. 1. In FIG. 1, the ordinate shows the birefringence (Δn), and the abscissa shows the wavelength dispersion (R450/R550). In addition, the straight lines (symbol I and symbol II) shown in FIG. 1 are straight lines represented by the following formula (I') and the following formula (II'), respectively. In addition, the plot points corresponding to Examples 1 to 4 are expressed by symbols E1 to E4, respectively, and the plot points corresponding to Comparative Examples 1 to 4 are expressed by symbols C1 to C4, respectively.

$$\Delta n = 0.0140 \times (R450/R550) - 0.0082 \quad \text{(I')}$$

$$\Delta n = 0.0140 \times (R450/R550) - 0.0080 \quad \text{(II')}$$

From FIG. 1, it can be understood that in Examples 1 to 4, the birefringence and the wavelength dispersion satisfy the relationship represented by the foregoing mathematical formula (I). In the "Judgement of formula (I)" in Table 1, "A" expresses that the relationship represented by the formula (I) is satisfied, whereas "C" expresses that the relationship represented by the formula (I) is not satisfied.

TABLE 1

| | | | Ex. 1 | Ex. 2 | Ex. 3 | Ex. 4 | Comp. Ex. 1 | Comp. Ex. 2 |
|---|---|---|---|---|---|---|---|---|
| Resin | Fluorene-based monomer | — | Comp. 3 | Comp. 3 | Comp. 3 | Comp. 3 | BHEPF | BHEPF |
| | Content of structural unit derived from fluorene-based monomer | % by mass | 26.2 | 27.0 | 21.0 | 26.6 | 67.8 | 63.4 |
| | Glass transition temperature (Tg) | ° C. | 157 | 125 | 130 | 126 | 145 | 145 |
| Unstretched film | Elastic modulus | GPa | 2.1 | 2.0 | 2.1 | 2.0 | 3.0 | 3.0 |
| | Bending test | — | A | A | A | A | A | A |
| | Saturated water absorption | % | 2.7 | 1.9 | 1.1 | 1.33 | 1.1 | 1.2 |
| | Refractive index at 656 nm ($n_C$) | — | 1.5387 | 1.5393 | 1.5159 | 1.5369 | 1.5980 | 1.5919 |
| | Refractive index at 589 nm ($n_D$) | — | 1.5452 | 1.5432 | 1.5202 | 1.5414 | 1.6042 | 1.5986 |
| | Refractive index at 486 nm ($n_F$) | — | 1.5528 | 1.5534 | 1.5270 | 1.5514 | 1.6200 | 1.6132 |
| | Abbe number ($v_D$) | — | 39 | 39 | 47 | 37 | 27 | 28 |
| | Whole light transmittance | % | 91.6 | 91.6 | 92.2 | 91.7 | 90.3 | 90.4 |
| | Photoelastic coefficient | $\times 10^{-12}$ Pa$^{-1}$ | 15 | 17 | 9 | 17 | 30 | 30 |
| Retardation film | Layer configuration | — | Single | Single | Single | Single | Single | Single |
| | Thickness of retardation plate | μm | 49 | 44 | 35 | 24 | 65 | 50 |
| | Retardation (R450) | nm | 107 | 109 | 115 | 126 | 120 | 129 |
| | Retardation (R550) | nm | 137 | 136 | 140 | 138 | 147 | 147 |
| | Wavelength dispersion (R450/R550) | — | 0.79 | 0.80 | 0.82 | 0.91 | 0.81 | 0.88 |
| | Birefringence (Δn) | — | 0.0028 | 0.0031 | 0.0040 | 0.0057 | 0.0023 | 0.0029 |
| | Value of formula (I) | — | 0.0028 | 0.0030 | 0.0033 | 0.0046 | 0.0032 | 0.0041 |
| | Judgment of formula (I) | — | A | A | A | A | C | C |
| | Change rate of retardation | % | 1.7 | 3.6 | 1.4 | 1.8 | 6.2 | 5.0 |
| Organic EL panel | Reflectance | % | 2.32 | 2.32 | 2.31 | 2.32 | 2.34 | 2.39 |
| | Hue u' | — | 0.207 | 0.208 | 0.204 | 0.203 | 0.189 | 0.185 |
| | Hue v' | — | 0.477 | 0.474 | 0.467 | 0.449 | 0.454 | 0.440 |
| | Color difference from neutral point (Δu'v') | — | 0.006 | 0.003 | 0.007 | 0.023 | 0.027 | 0.039 |

TABLE 1-continued

|  |  |  | Comp. Ex. 3 | Comp. Ex. 4 | Comp. Ex. 5 | Comp. Ex. 6 |
|---|---|---|---|---|---|---|
| Resin | Fluorene-based monomer |  | — | BCF | BHEPF | — | — |
|  | Content of structural unit derived from fluorene-based monomer | % by mass | 32.0 | 80.1 | — | — |
|  | Glass transition temperature (Tg) | °C. | 135 | 149 | 135 | 160 |
| Unstretched film | Elastic modulus | GPa | 3.0 | 2.5 | 1.7 | 2.5 |
|  | Bending test | — | C | A | A | A |
|  | Saturated water absorption | % | 0.6 | 0.5 | <0.1 | 4.3 |
|  | Refractive index at 656 nm ($n_C$) | — | 1.5291 | 1.6245 | 1.5312 | 1.4993 |
|  | Refractive index at 589 nm ($n_D$) | — | 1.5334 | 1.6317 | 1.5340 | 1.5018 |
|  | Refractive index at 486 nm ($n_F$) | — | 1.5442 | 1.6506 | 1.5409 | 1.5075 |
|  | Abbe number ($\nu_D$) | — | 35 | 24 | 55 | 61 |
|  | Whole light transmittance | % | 91.7 | 89.9 | 91.9 | 92.7 |
|  | Photoelastic coefficient | $\times 10^{-12}$ $Pa^{-1}$ | 13 | 52 | 4 | 16 |
| Retardation film | Layer configuration | — | Single | Single | Laminated | Single |
|  | Thickness of retardation plate | μm | 71 | 72 | 67 | 12 |
|  | Retardation (R450) | nm | 129 | 120 | (ZF14-040) 141 (ZF14-050) 273 | 144 |
|  | Retardation (R550) | nm | 140 | 137 | (ZF14-040) 140 (ZF14-050) 270 | 141 |
|  | Wavelength dispersion (R450/R550) | — | 0.92 | 0.87 | 0.91 | 1.02 |
|  | Birefringence (Δn) | — | 0.0020 | 0.0019 | (ZF14-040) 0.0042 (ZF14-050) 0.0079 | 0.0116 |
|  | Value of formula (I) | — | 0.0047 | 0.0040 | 0.0059 | 0.0061 |
|  | Judgment of formula (I) | — | C | C | C | A |
|  | Change rate of retardation | % | 1.4 | 8.1 | 0.8 | -0.7 |
| Organic EL panel | Reflectance | % | 2.34 | 2.30 | 2.36 | 2.39 |
|  | Hue u' | — | 0.204 | 0.211 | 0.188 | 0.205 |
|  | Hue v' | — | 0.447 | 0.467 | 0.439 | 0.416 |
|  | Color difference from neutral point (Δu'v') | — | 0.025 | 0.005 | 0.038 | 0.055 |

While the present invention has been described in detail and with reference to specific embodiments thereof, it will be apparent to one skilled in the art that various changes and modifications can be made therein without departing from the spirit and scope of the present invention. This application is based on Japanese Patent Application (Patent Application No. 2014-084696) filed on Apr. 16, 2014, the contents of which are incorporated herein by way of reference.

The invention claimed is:

1. A circularly polarizing plate comprising a retardation film and a polarizer stacked on the retardation film, the retardation film comprising a thermoplastic resin and composed of a single layer,
wherein the retardation film has:
a value of wavelength dispersion (R450/R550) as a ratio of an in-plane retardation (R450) at a wavelength of 450 nm and an in-plane retardation (R550) at a wavelength of 550 inn being 0.75 or more and 0.92 or less;
a birefringence (Δn) at a wavelength of 550 nm satisfying a relationship of the following mathematical formula (I) with the wavelength dispersion (R450/R550); and
a photoelastic coefficient of $25 \times 10^{-12}$ $Pa^{-1}$ or less:

birefringence=$R550$[nm]/(film thickness[mm]$\times 10^6$), $$\Delta n \geq 0.0140 \times (R450/R550) - 0.0082 \tag{I}$$

wherein the thermoplastic resin comprises at least one bonding group of a carbonate bond and an ester bond and one or more structural units selected from the group consisting of a structural unit represented by the following general formula (1) and a structural unit represented by the following general formula (2),
wherein in the thermoplastic resin, a content of an aromatic group-containing structural unit other than the structural unit represented by the general formula (1) and the structural unit represented by the general formula (2) is 5% by mass or less:

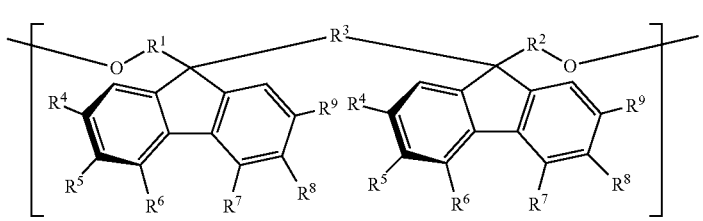

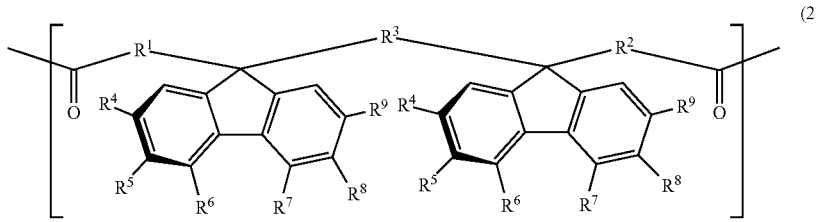

wherein in the general formula (1) and the general formula (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring.

2. The circularly polarizing plate according to claim 1, wherein the thermoplastic resin has a refractive index at a sodium d line (589 mm) of from 1.49 to 1.56.

3. The circularly polarizing plate according to claim 1, wherein the thermoplastic resin has a glass transition temperature of 120° C. to 160° C.

4. The circularly polarizing plate according to claim 1, wherein the thermoplastic resin has an elastic modulus of 1 GPa to 2.5 GPa.

5. The circularly polarizing plate according to claim 1, wherein the thermoplastic resin comprises the structural unit represented by the general formula (1) or the general formula (2) in an amount of 1% to 40% by mass in total.

6. The circularly polarizing plate according to claim 1, wherein the thermoplastic resin comprises a structural unit represented by the following general formula (3)

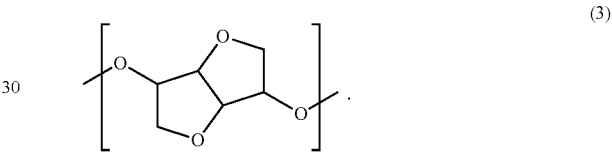

7. An image display device comprising the circularly polarizing plate according to claim 1.

8. An organic EL panel comprising the circularly polarizing plate according to claim 1.

* * * * *